United States Patent
Wood

(10) Patent No.: US 7,812,648 B2
(45) Date of Patent: Oct. 12, 2010

(54) FREQUENCY DIVIDER

(75) Inventor: John Wood, Santa Cruz, CA (US)

(73) Assignee: Multigig Inc., San Jose, CA (US)

( * ) Notice: Subject to any disclaimer, the term of this patent is extended or adjusted under 35 U.S.C. 154(b) by 0 days.

(21) Appl. No.: 11/936,008

(22) Filed: Nov. 6, 2007

(65) Prior Publication Data

US 2008/0258780 A1    Oct. 23, 2008

Related U.S. Application Data

(63) Continuation of application No. 11/689,412, filed on Mar. 21, 2007, now abandoned.

(60) Provisional application No. 60/743,621, filed on Mar. 21, 2006.

(51) Int. Cl.
*H03B 19/00* (2006.01)

(52) U.S. Cl. ...................... 327/117; 327/115

(58) Field of Classification Search ................ 327/115, 327/117, 118, 113, 114
See application file for complete search history.

(56) References Cited

U.S. PATENT DOCUMENTS

| | | | | |
|---|---|---|---|---|
| 5,390,223 A | * | 2/1995 | Lindholm | 377/49 |
| 5,442,670 A | * | 8/1995 | Shu | 377/48 |
| 5,495,206 A | | 2/1996 | Hietala | |
| 6,469,549 B2 | * | 10/2002 | Carson et al. | 327/115 |
| 6,965,259 B2 | | 11/2005 | Saeki | |
| 7,332,945 B2 | * | 2/2008 | Hu | 327/115 |
| 7,425,850 B2 | * | 9/2008 | Widerin | 327/117 |
| 2005/0225365 A1 | | 10/2005 | Wood | |

OTHER PUBLICATIONS

Yang, Lixin, et al.: "A Non-Feedback Multiphase Clock Generator", IEEE International Symposium on Circuits and Systems, ISCAS 2002, 4 pages.*
International Search Report from PCT/US07/64562 dated Feb. 27, 2008.

* cited by examiner

*Primary Examiner*—Hai L Nguyen
(74) *Attorney, Agent, or Firm*—IPxLaw Group LLP

(57) ABSTRACT

A frequency divider using a clock source with a plurality of phase signals of a multi-phase oscillator. In one version, the divider includes a plurality of spot-moving stages that are connected to form a ring. Spot-moving stages are stages that advance a one or a zero, while clearing the previous stage. Depending on the number of stages and the number of phases of the clock to advance a spot through all of the stages, a divider ratio is determined. In another embodiment, a plurality of latch elements is provided with a divided input and each is re-clocked with the phases of a multi-phase oscillator. The outputs of the latch elements are combined in a capacitor array to create the output waveform. An interpolator useful in conjunction with a frequency divider is also disclosed. When the interpolator is placed in the feedback path of a PLL, a fractional frequency multiplier/divider results.

15 Claims, 31 Drawing Sheets

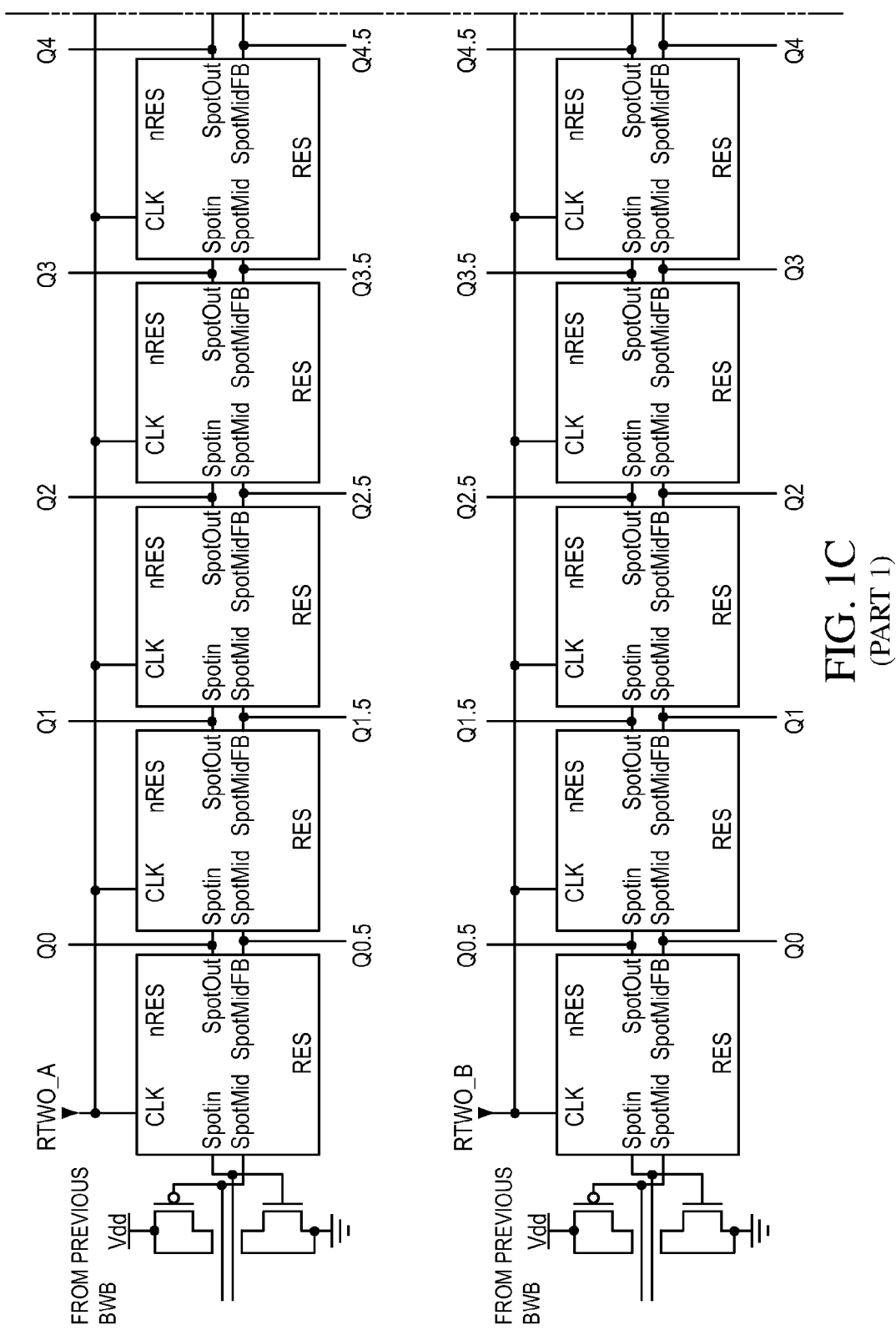
FIG. 1C (PART 1)

(PART 2)

FREQUENCY DIVIDER

CROSS-REFERENCE To RELATED APPLICATIONS

This application is a continuation of U.S. patent application Ser. No. 11/689,412, filed Mar. 21, 2007, and titled "FREQUENCY DIVIDER," which claims priority to U.S. Provisional Application Ser. No. 60/743,621, filed Mar. 21, 2006, and titled "FREQUENCY DIVIDER", which provisional application is incorporated by reference into the present application.

This application is related to the PCT/GB03/000175 application, filed Jan. 24, 2000, which is incorporated by reference into the present application.

FIELD OF THE INVENTION

This application relates generally to the field of frequency dividers and more particularly to the field of frequency dividers using multi-phase clocks.

DESCRIPTION OF THE RELATED ART

A spot sequencer, FIGS. 1A-1C, was disclosed in the PCT/GB03/000175 application. That application describes a moving-spot sequencer with a 20-bit sequence FIG. 1A, FIG. 1C, wherein the state (i.e., spot) advances every half-cycle of the RTWO clock signal. Each stage in FIG. 1C in the sequencer is a special spot moving structure shown in FIG. 1B designed to pass a "one" (or a "zero") to the next stage which then clears (sets) the previous stage. By this means a "one" (i.e., spot) moves through out the chain of stages, with only one stage at any one time having a "one" in it. It does not matter whether the spot is a one or a zero in one of the stages, as long as the other stages have the opposite state.

BRIEF SUMMARY OF THE INVENTION

A moving spot sequencer configured as a ring is used to create arbitrary dividers using a multiphase clock and minimal hardware. The total number of phases P it takes to advance a 'one' through all of the stages determines the divide factor, where the phases P are those of the M-phase clock that operates the stages. For example, a structure that takes 20 phases of a two-phase oscillator to move the one through all of the stages implements a divide-by-10 function. A structure that takes 12 phases of a four-phase oscillator to advance the 'one' through all of the stages implements a divide-by-3 function. A structure that takes 100 phases of a 20 phase oscillator to advance the 'one' through all of the stages implements a divide-by-5 function.

To cut down on the amount of hardware for large divide ratios, the one-spot structures can be cascaded so that the stages in one structure are available to clock the stages of the downstream structure.

One embodiment of the present invention is a frequency divider that includes a clock source and a plurality of spot moving stages. The clock source has a plurality of phases and phase signals, where each phase signal has the same period. Each stage of the plurality of spot moving stages has a spot input, a spot output, and a clock input. The spot input of one stage is connected to the spot output of the previous stage so as to form a ring. The clock input of each stage is connected to one of the phase signals of the clock source so as to advance the spot to the next stage after a particular number of phases of the clock source. The number of phases of the clock source that advances the spot through all of the stages of the ring determines a total number of period of the clock source that occur during a single period of the ring. The number of periods of the clock source is the frequency divider ratio and the frequency divided output is available at any of the spot stages.

Another embodiment of the present invention is a method of dividing an input frequency to produce an output frequency. The method includes (i) initializing a spot in one of a plurality of spot stages configured as a ring, the other stages having no spot, (ii) advancing the spot at each stage by a particular number of phases of a multi-phase clock that cycles at the input frequency so that the number of phases it takes to advance the spot through all of the stages determines the number of cycles of the input frequency that occur for each cycle of the output frequency, said output frequency being available at any of the stages.

Yet another embodiment of the present invention is a method of dividing an input frequency to produce an output frequency. The method includes (i) initializing a spot in one of a plurality of spot stages of a first ring, the other stages having no spot, (ii) initializing a spot in one of a plurality of spot stages of a second ring, the other stages having no spot, (iii) causing the spot in the first ring to advance by a particular number of phases of a multi-phase clock such that each stage of the first ring provides a phase cycling at the input frequency, and (iv) advancing the spot at each stage in the second ring by a particular number of phases in the cycle of the first ring so that the number of phases it takes to advance the spot through all of the stages of the second ring determines the number of cycles of the input frequency that occur for each cycle of the output frequency, said output frequency being available at any of the stages of the second ring.

Yet another embodiment of the present invention is a phase selection system that includes a rotary clock, a plurality of interpolators, a multiplexer, and an up/down counter. The rotary clock has a plurality of phase signals, where each said phase signal has the same period. Each interpolator of the plurality of interpolators has a plurality of control inputs for controlling the degree of interpolation, a pair of phase signal inputs connected to rotary clock phase signals to be interpolated, and an output that carries the interpolated phase signal. The multiplexer has a plurality of data inputs each connected to one of the interpolator outputs, and a plurality of control inputs operable to control the selection of one of the data inputs as a multiplexer output, said multiplexer output being the phase selection system output. The up/down counter has an input that receives an input clock and a plurality of outputs, where each connected to one of the control inputs of the plurality of interpolators and one of the control inputs of the multiplexer. The count present in the up/down counter determines the degree of interpolation of each interpolator and the selection by the multiplexer of an interpolator output.

Yet another embodiment includes a frequency divider that includes clock source, a divide-by-N device, a plurality of latch stages, and a plurality of capacitors. The clock source has a plurality of phase signals, where each said phase signal having the same period. The divide-by-N device is connected to an input frequency to be divided and operative to provide an output that is the input frequency divided by N. Each of the plurality of latch stages has at least one clock input and a data input, and a data output, where each said clock input is connected to one of the phase signals of the clock source, and each said data input is connected to the output of the divide-by-N device. Each of the plurality of capacitors has one node connected to one of the latch stage data outputs and the other node connected to a common node that provides the frequency divider output.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 1A:
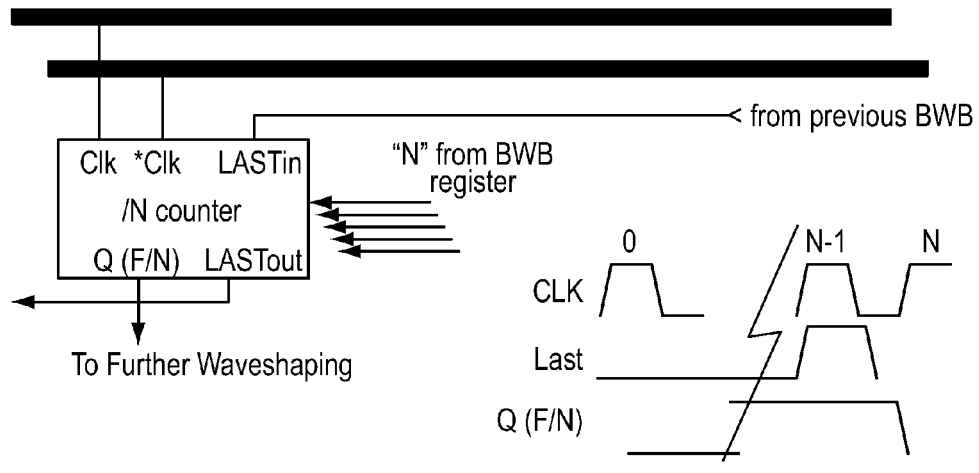
FIGS. 1A-1C shows the one-spot device of the PCT/GB03/000175 application.
Figure 1A:
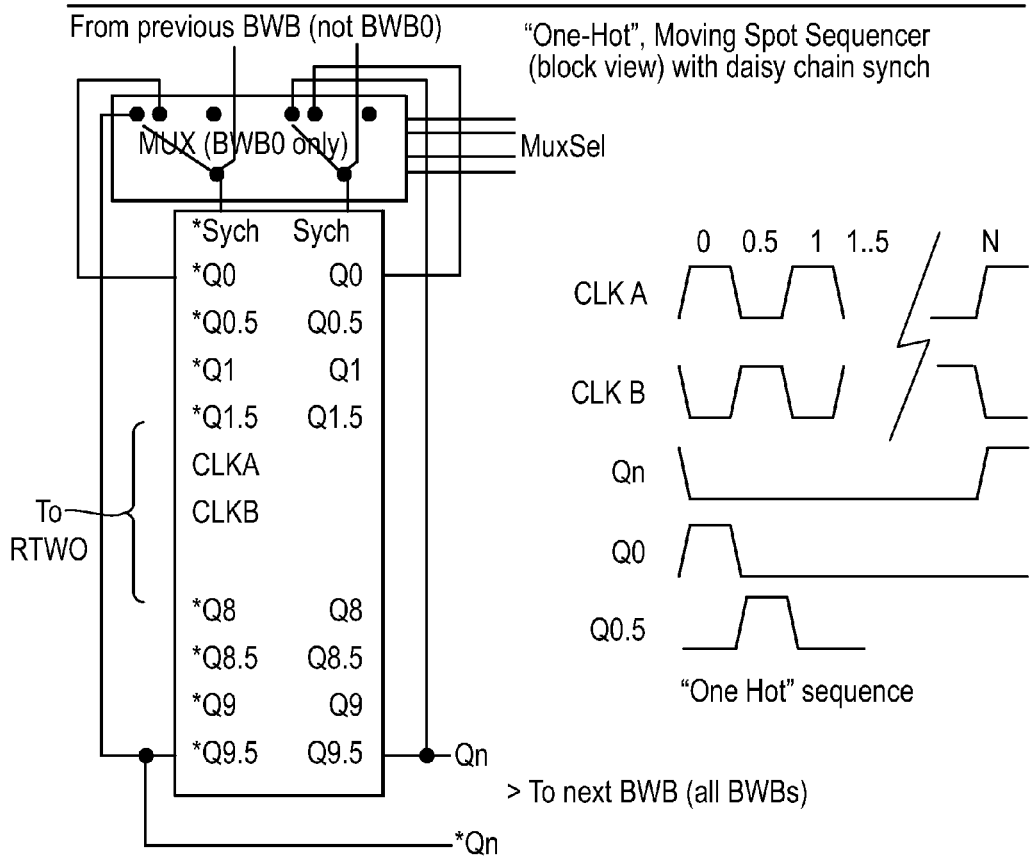
Figure 1B:
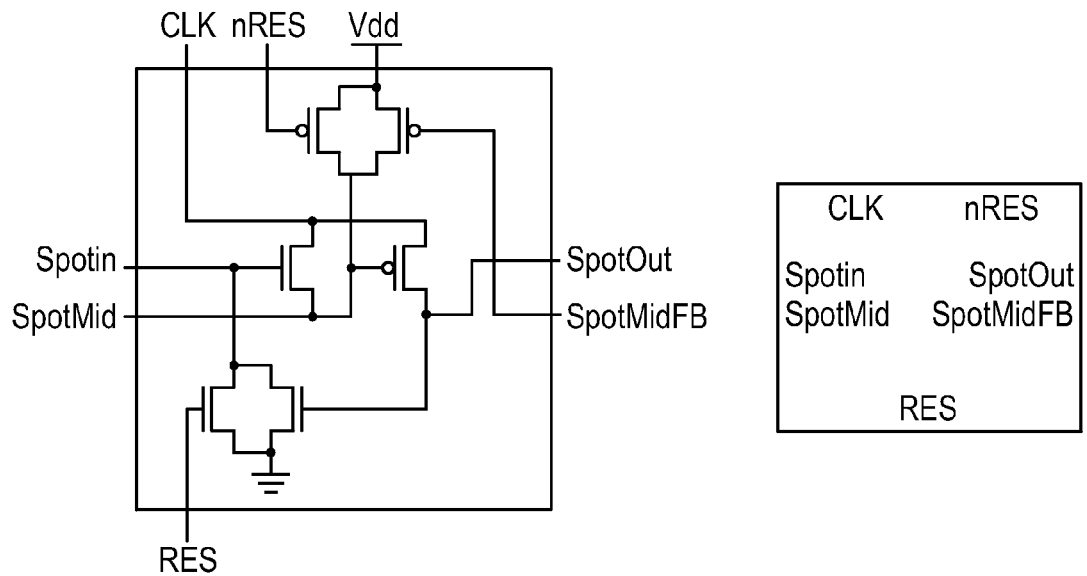
Figure 2:
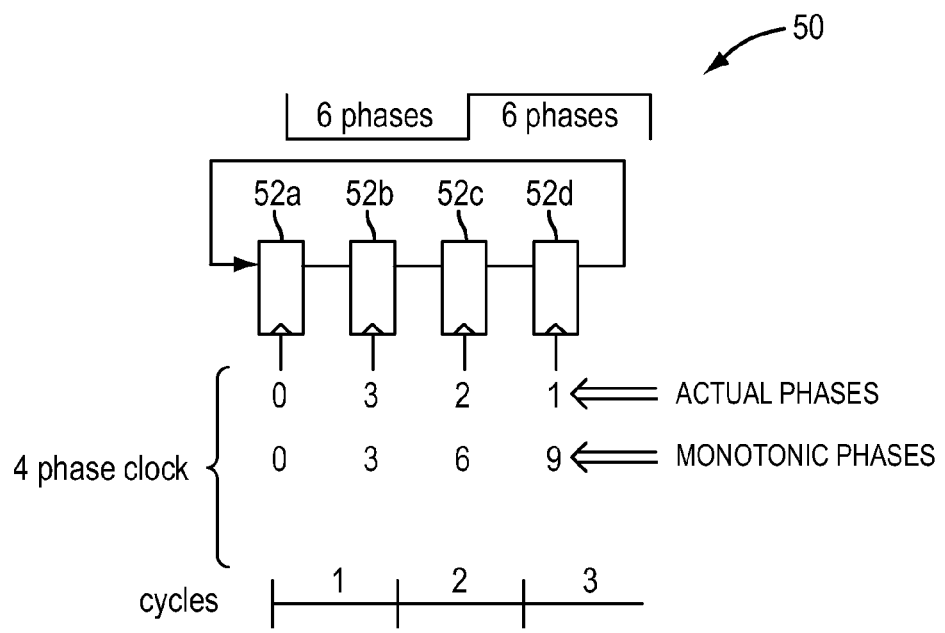
FIG. 2 shows a one-spot device for implementing a divide-by-3.
Figure 1C:
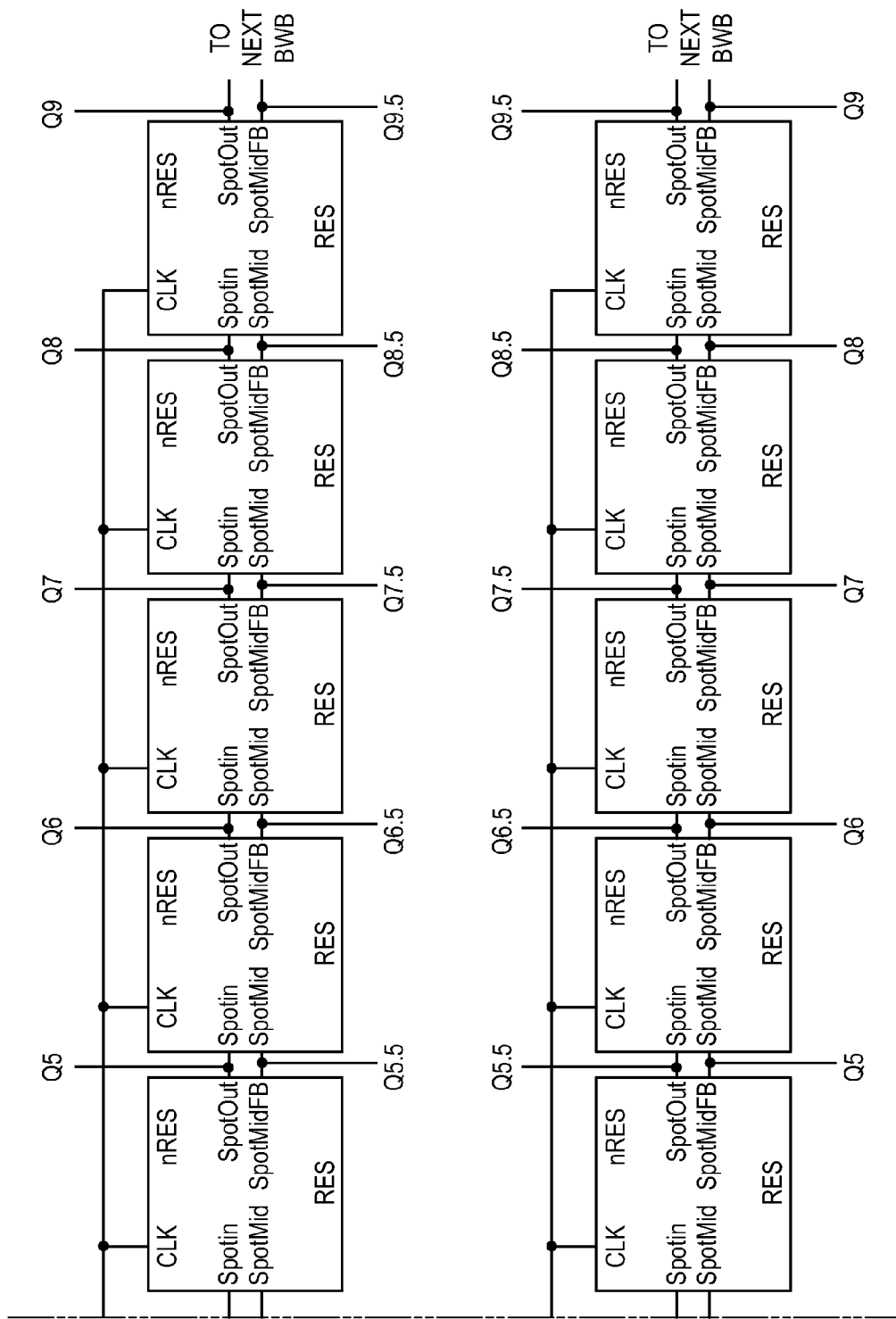

FIG. 2 shows a one-spot device 50 for implementing a divide-by-3. In this device, there are four spot stages 52a-d, connected in series, with the fourth 52d connected back to the first 52a, to form a ring. A multi-phase oscillator having four phases 0 through 3 is used to clock the stages. The first stage 52a is clocked with phase 0, the second with phase 3, the third with phase 2, and the fourth with phase 1. Because, in each stage the spot moves three phases, a monotonic sequence of phases for stages 1 through 4 is 0, 3, 6, 9, 12 (0) respectively, as shown in the figure. Thus, it takes a total time of 12 phases of the four-phase (per cycle) clock to advance the spot through all of the ring stages 52a-d, resulting in a divide-by-3 function. Because each stage 52a-d delivers a pulse that is 3 phases in duration and the period of the pulse is 12 phases, the duty cycle of each stage is ¼. Signals with different duty cycles can be synthesized directly from the pulses from the stages using decoders.

Figure 3A:
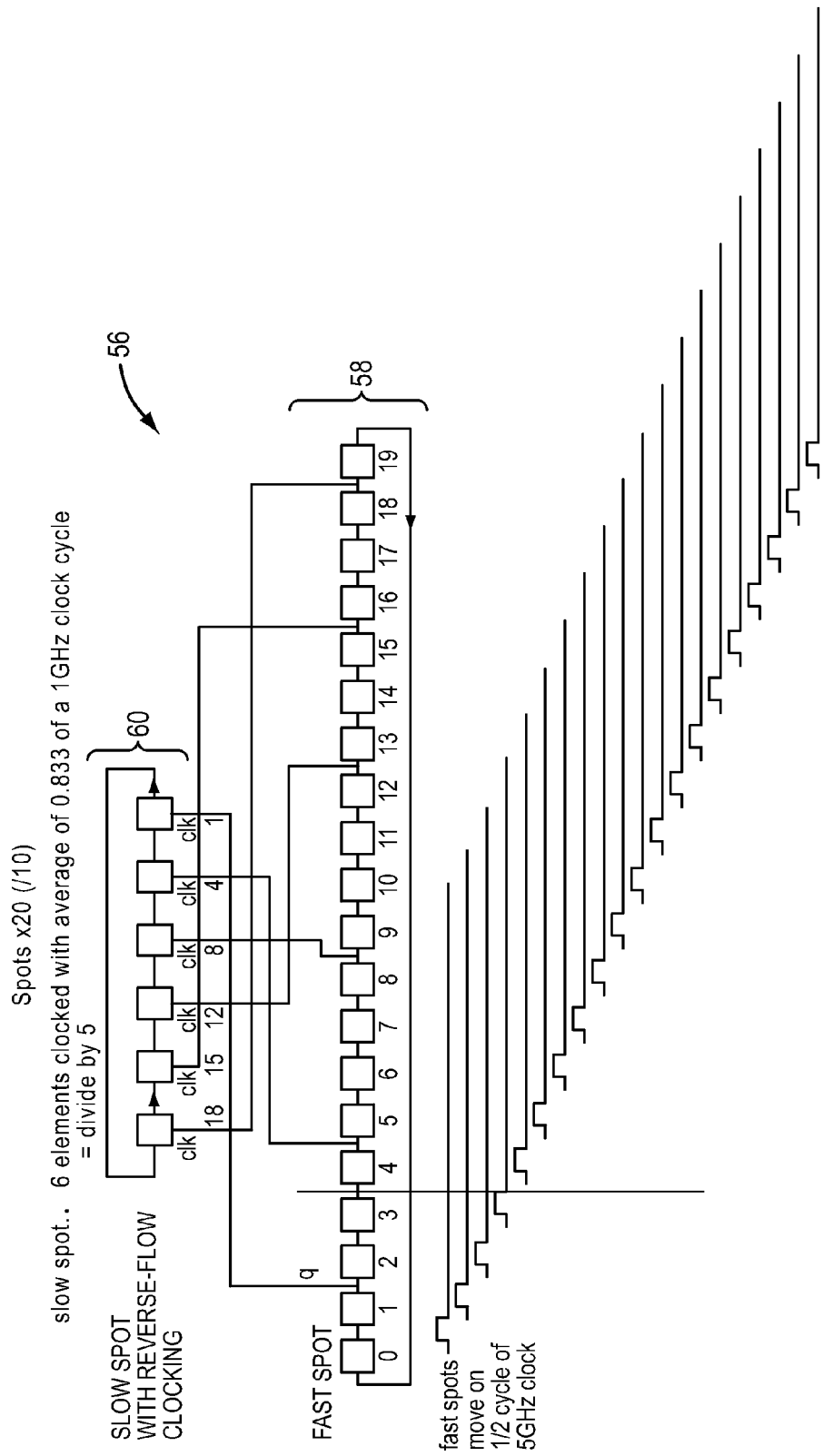
FIG. 3A shows a cascaded set of one-spot devices for implementing a divide-by-50 function.

FIG. 3A shows a cascaded set of one-spot devices for implementing a divide-by-50 function 56. The first device 58 is a 20-stage moving spot ring that implements a divide-by-10 function and the second device 60 is a 6-stage moving spot ring that implements a divide-by-5. The first 58 and second 60 rings are effectively connected with opposing rotations, which causes each stage of the second device 60 to advance by at least an extra cycle of the clock from the first device. The first ring 58, with 20 moving spot stages, is clocked with a two-phase (per cycle) clock to give the divide-by-10 function. The second ring 60, with 6 moving spot stages is clocked with a 20-phase clock (the clock from the first ring) to implement a divide-by-five function.

Figure 3B:
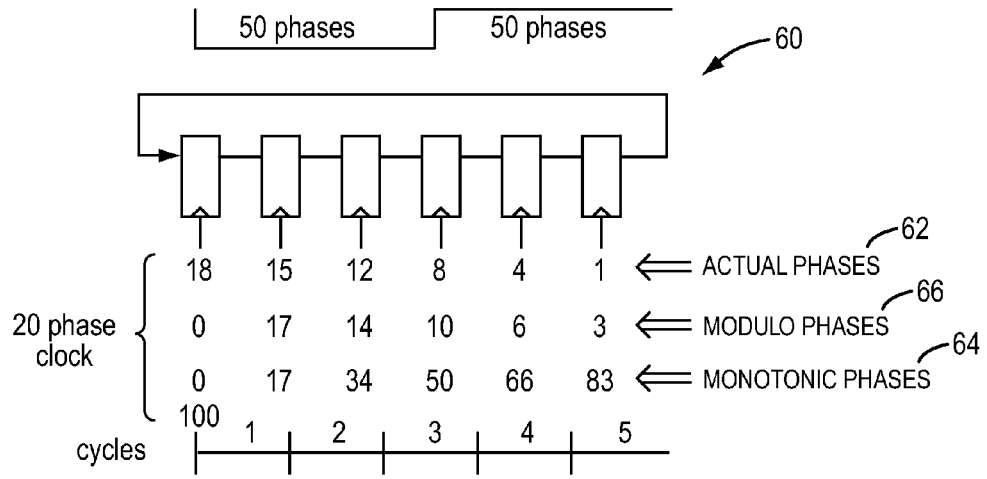
FIG. 3B shows an analysis of the divide-by-five portion of the divider in FIG. 3A in which a twenty-phase clock is used.

FIG. 3B shows an analysis of the divide-by-five portion 60 of the divider 56 in FIG. 3A. The actual phases 18, 15, 12, 8, 4 and 1, of the 20-phase clock are used, in that order, to advance the spots in the divider. This is shown in the first row 62 on numbers under the stages. The second row 66 of numbers normalizes the first stage to phase 0 by forming the sum (18+2) mod 20. The other numbers are adjusted the same way. The third row 64 of numbers gives the monotonic phase sequence for the stages in the divider with the last stage (the first stage) ending at 100. Thus, it takes a total of 100 phases or five cycles of a 20-phase clock to move the spot through all of the stages, thus yielding the divide-by-five function.

Figure 4A:
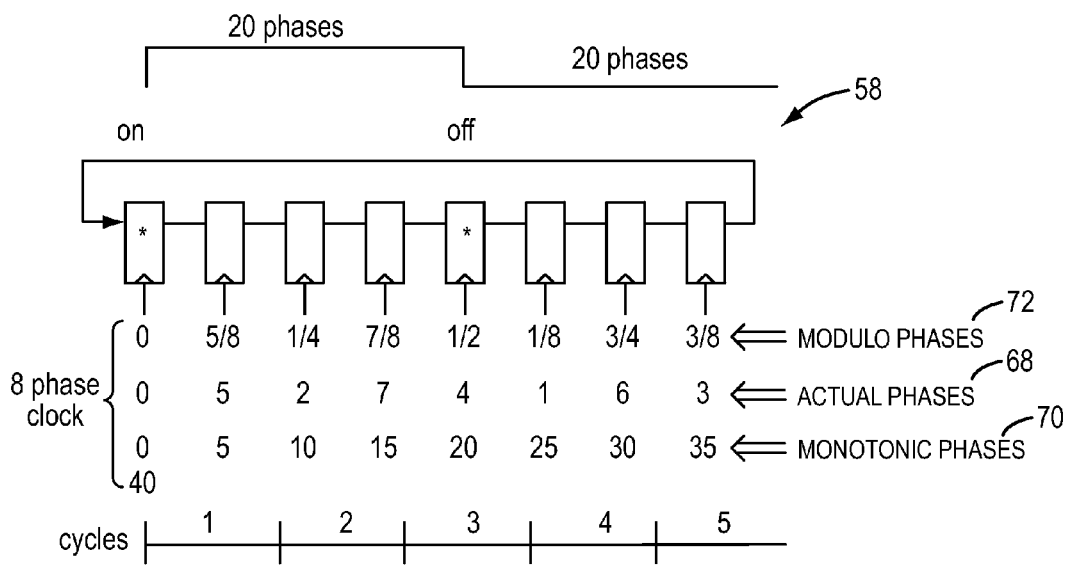
FIG. 4A shows an analysis of a divide-by-five using an 8-phase clock.

FIG. 4A shows an analysis of a divide-by-five portion 58 using an 8-phase clock. In this case, the stages are connected to actual phases 0, 5, 2, 7, 4, 1, 6, and 3 of the 8-phase clock, shown in row 68. The monotonic phase 70 sequence 0, 5, 10, 15, 20, 25, 30, 35, 40 is also shown in the figure to indicate that it takes a total of 40 phases of a 8-phase clock (five cycles) to move the spot through all of the stages of the ring. This gives a divide-by-five function. The modulo phases are shown in row 72.

Figure 4B:
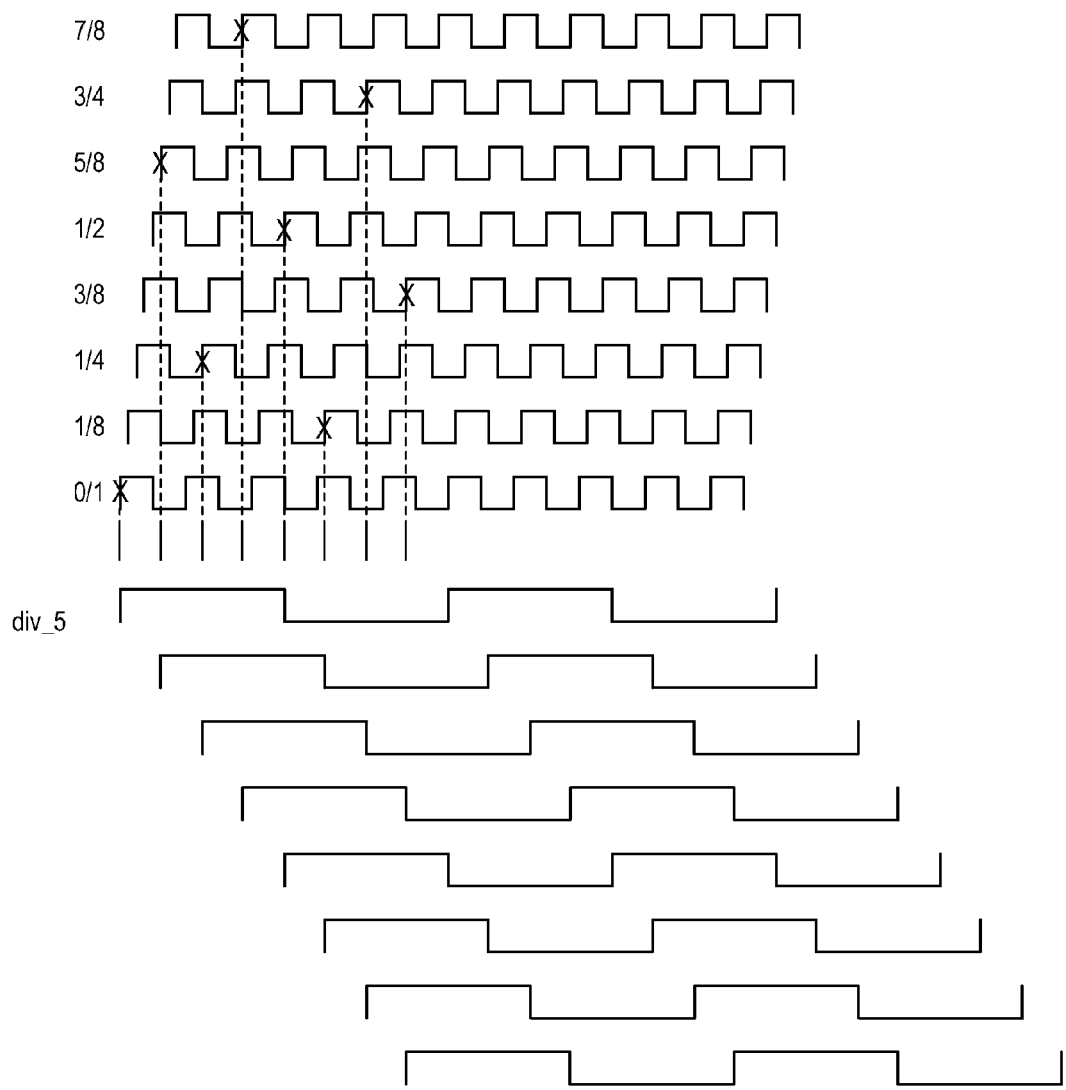
FIG. 4B shows an timing diagram of the divide-by-five divider of FIG. 4A.

FIG. 4B shows an timing diagram of the divide-by-five divider of FIG. 4A.

Figure 5A:
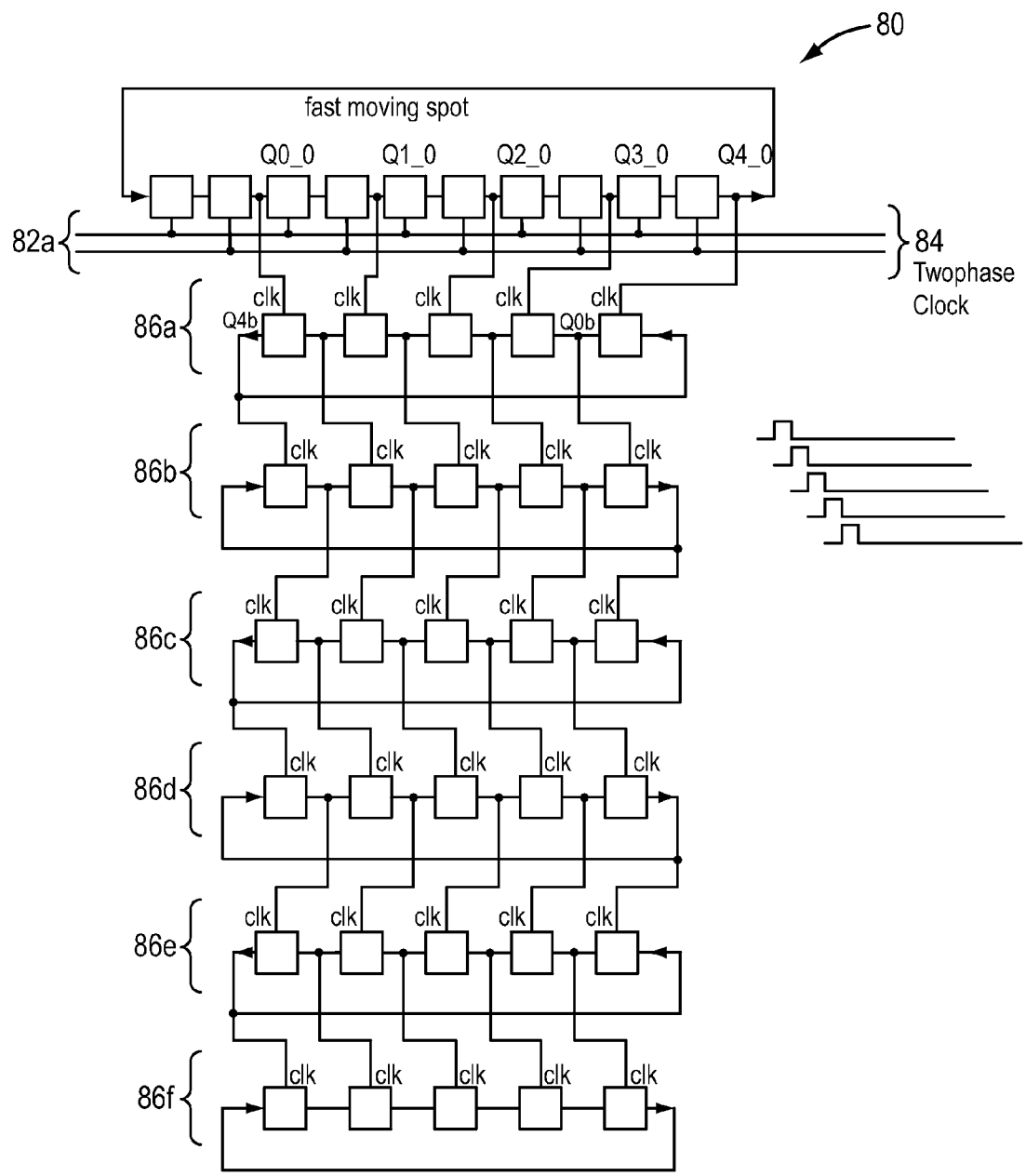
FIG. 5A shows a cascaded set of one-spot device for implementing a divide-by-20480 divider.

FIG. 5A shows a cascaded set of one-spot devices for implementing a divide-by-20480 divider 80. Operating directly on a two-phase clock 84 is a 10-stage moving spot ring 82 that implements a divide-by-five function. Connected downstream to the 10-stage moving spot ring is a five stage moving spot ring 86a, which implements a divide-by-4 function. There are a total of six 86a-f divide-by-4 dividers cascaded in the figure, for a total divide ratio of $4^6$ or $2^{12}$ subsequent to the divide-by-five portion 82.

Figure 5B:
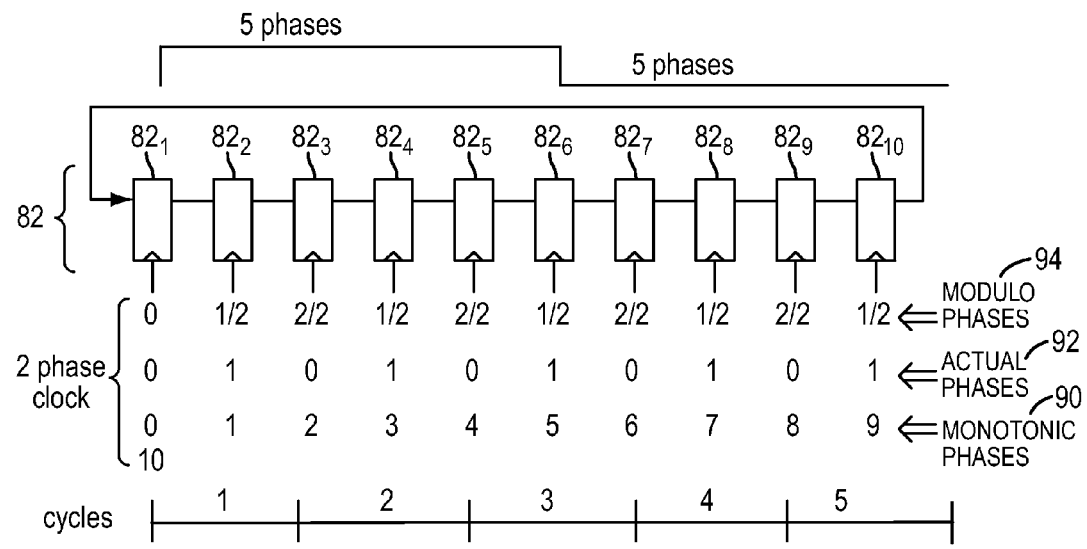
FIG. 5B shows an analysis of the divide-by-5 portion and the divide-by-4 portion of FIG. 5A.
Figure 5C:
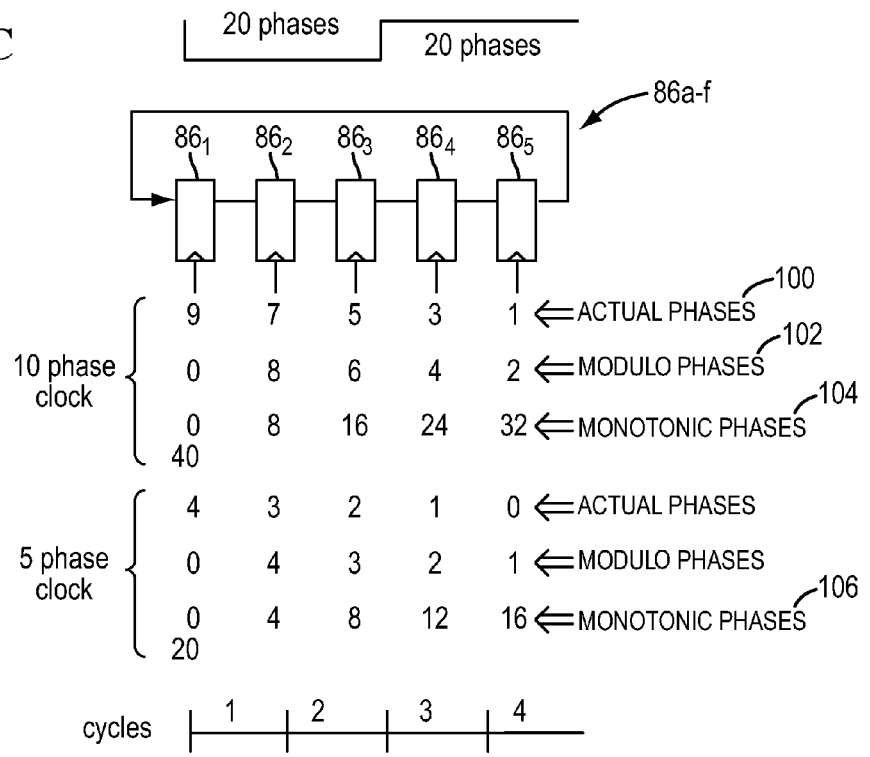
FIG. 5C shows an analysis of the divide-by-4 portion of FIG. 5A.

FIG. 5B shows an analysis of the divide-by-5 portion 82 of FIG. 5A. The divide-by-five portion 82 has 10 moving spot stages $82_1$-$82_{10}$ with a monotonic sequence 90 (0, 1, 2, 3, 4, 5, 6, 7, 8, 9, and 10 (0)) of the two-phase (per cycle) clock. Therefore, it takes this ring 10 phases of a 2-phase clock to advance the spot through all of the stages, thus yielding a divide-by-five function. The actual phases are shown in row 92 and the modulo phases are shown in row 94. FIG. 5C shows an analysis of the divide-by-4 portions 86a of FIG. 5A. This ring has 5 stages $86_1$-$86_5$ and is clocked with phases 100 (9, 7, 5, 3, and 1) from the 10-phase clock (divide-by-five portion) of FIG. 5A. The next row of numbers 102 shows the normalization of the first stage to phase 0, which requires an addition of 1 mod 10. The numbers are then converted to a monotonic phase sequence 104 of (0, 8, 16, 24, 32, and 40 (0)). Thus, it takes 40 phases of the 10-phase clock to advance the spot through all of the stages, yielding a divide-by-four function. Subsequent divide-by-four stages 86b-f shown in FIG. 5A are also analyzed in FIG. 5C. The monotonic phase sequence 106 of these rings is 0, 4, 8, 12, 16 and 20 (0), each being clocked by a five phase clock (from the previous ring). This also yields a divide-by-four function.

Figure 6A:
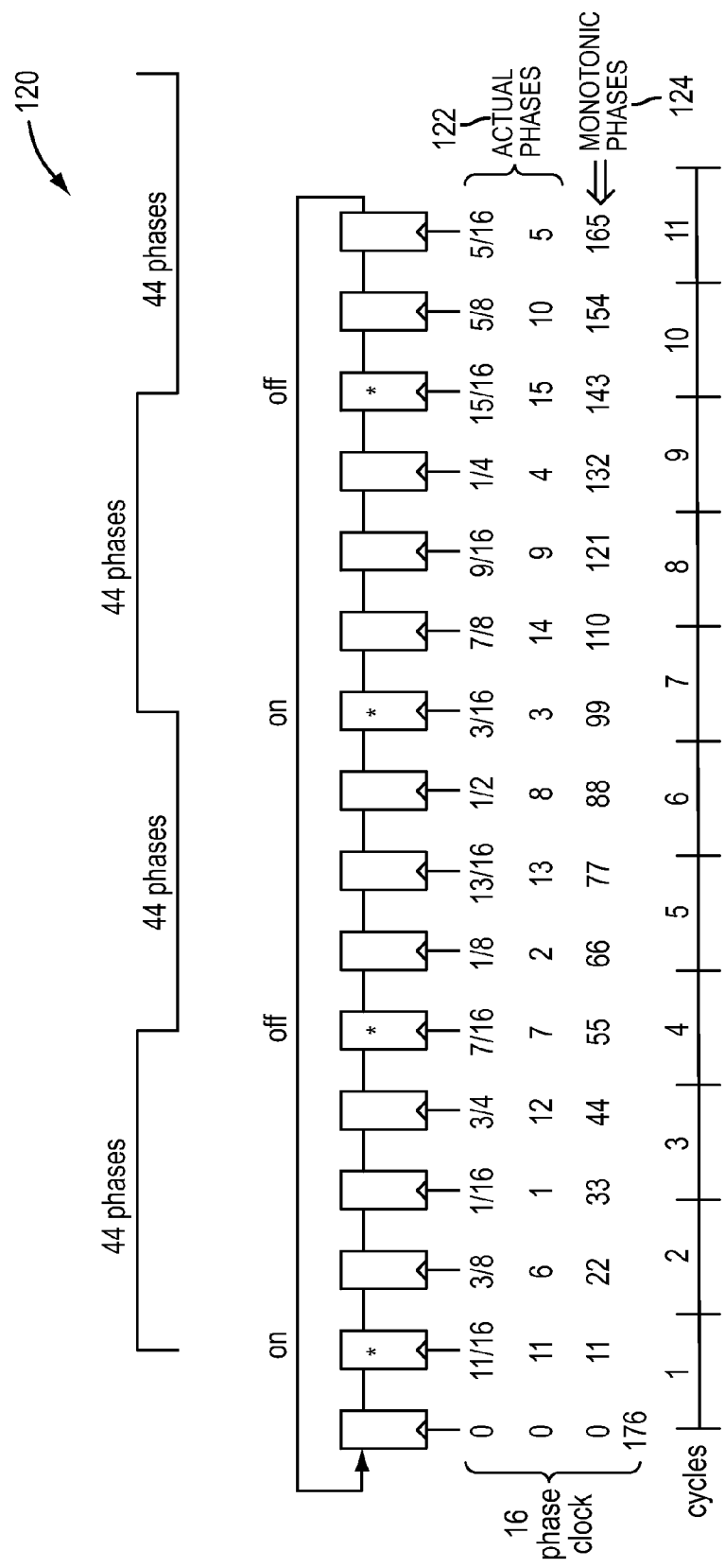
FIG. 6A shows an analysis of a divide-by-5.5 divider using a 16 phase clock.

FIG. 6A shows an analysis of a divide-by-5.5 divider 120 using a 16-phase clock. The first and second rows 122 of numbers under the moving spot stages are the phases of the 16 phase clock that are connected to the spot stages. The next row of numbers is the monotonic phase sequence 124 caused by those connections. The monotonic sequence is 0, 11, 22, 33, 44, 55, 66, 77, 88, 99, 110, 121, 132, 143, 154, 165, and 176 (0). Thus, it takes a total of 176 phases of 16-phase clock to move the spot through all of the stages in the ring, yielding a divide-by-11 function. If divide-by-5.5 is needed, it is possible, as shown in the figure, to derive two cycles of an output waveform, during one cycle of the ring. Thus, if a decoder decodes monotonic phase 11 to turn on a state device and monotonic phase 55 to turn that device off, and again decodes monotonic phase 99 to turn the device on monotonic phase 143 to turn it off again, two cycles of the output waveform occur during one cycle of the ring. It should be noted that because there are two cycles of output from the flip-flop for every one cycle of the ring, there is a possibility of some jitter if the 'on' monotonic phases, 11 and 99, or the 'off' monotonic phases, 55 and 143, do not exactly align.

Figure 6B:
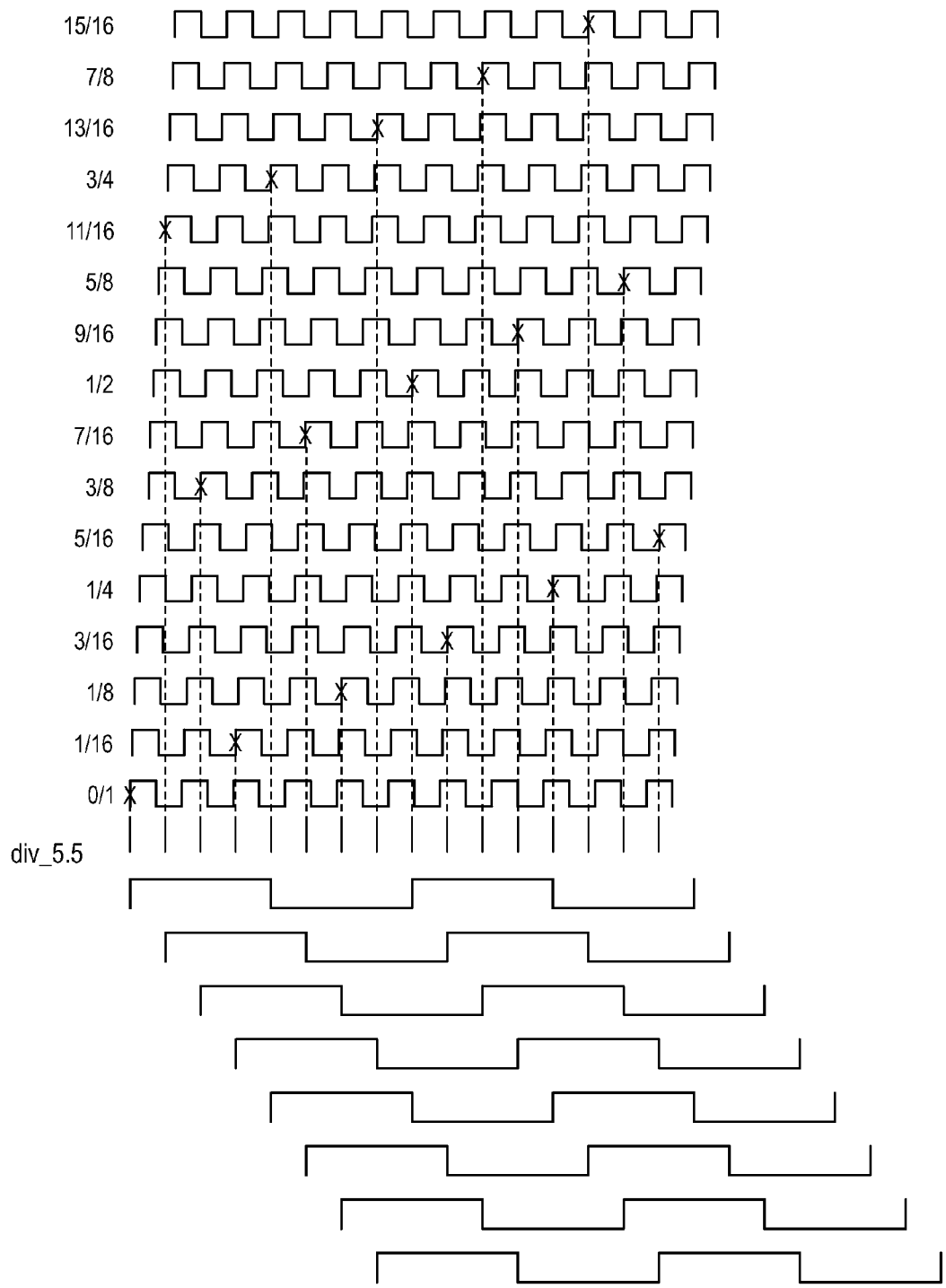
FIG. 6B shows a timing diagram of the divide-by-5.5 divider of FIG. 6A.

FIG. 6B shows a timing diagram of the divide-by-5.5 divider of FIG. 6A.

Figure 6C:
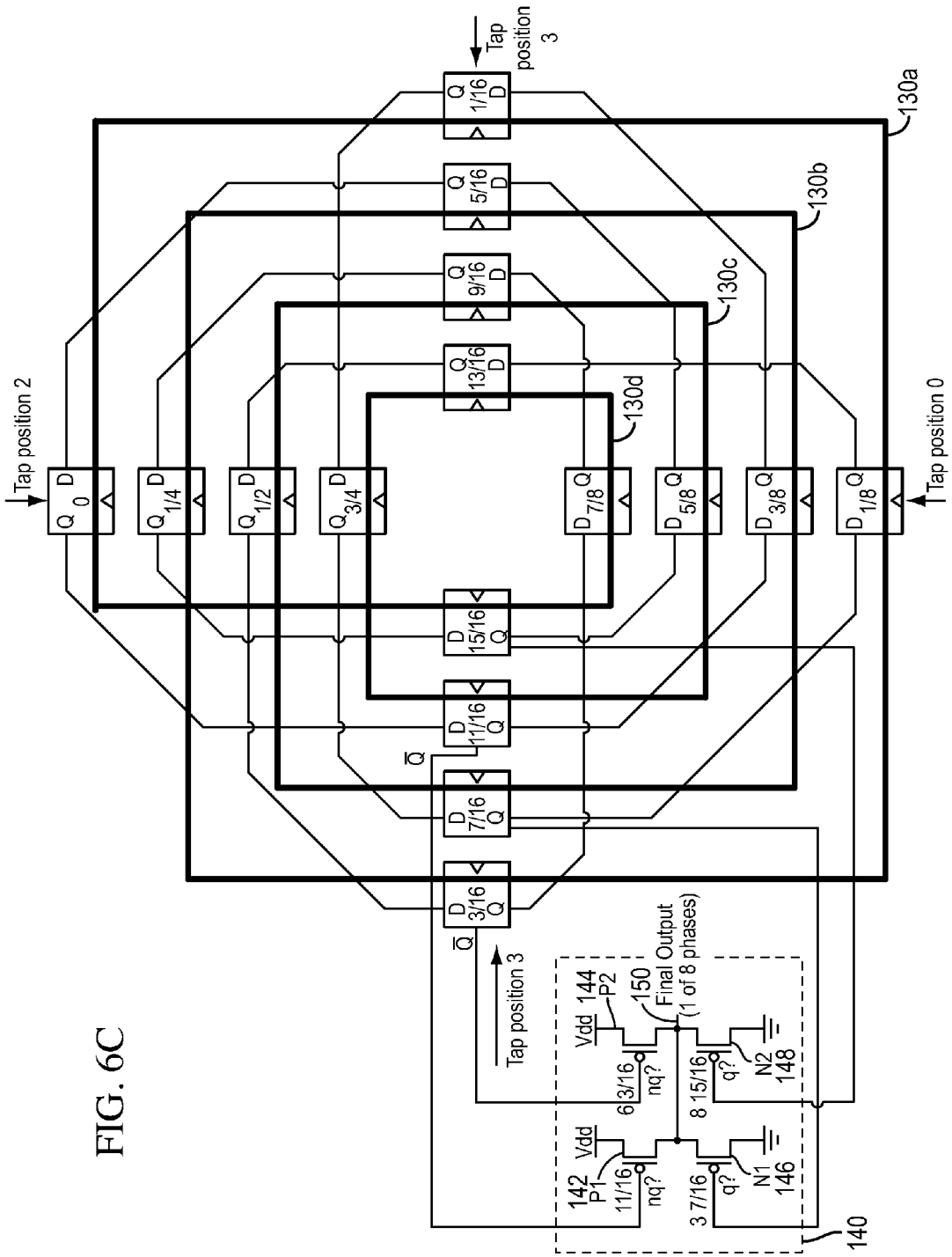
FIG. 6C shows a physical layout of the divide-by-5.5 divider shown in FIG. 6A.

FIG. 6C shows a physical layout of the 5.5 divider shown in FIG. 6A, including the placements of the spot stages and one of the output flip-flops on an RTWO 130. The RTWO 130, described in U.S. Pat. No. 6,556,089 (which is incorporated by reference into the present application), is an infinite-phase oscillator, i.e., any phase can be obtained from the oscillator by simply making a connection to the oscillator at a particular physical position. In the embodiment shown, there are four tap positions 0-3 in each of the four physical rings 130a-d. A spot stage at each tap position gives 16 spot stages. The 16 available phases permit phases, such as phases 11 and 99 and phases 55 and 143, to be adjacent on the oscillator. This is important because phases 11 and 99 must be very closely aligned to prevent jitter in the output flip-flop. Also shown in FIG. 6C is a decoder 140 for creating the divide-by-5.5 function. The decoder 140 includes four transistors P1 142, P2 144, N1 146 and N2 148. P1 142 and N1 146 have their channels connected in series between the supply and ground as do P2 144 and N2 148. The junction points of the series-connected channels are connected together and that junction is the decoder output 150. In operation, when phase 11 (11/16) occurs, transistor P1 142 turns on causing the decoder output 150 to go high. When phase 55 occurs (3 7/16), transistor N1 146 turns on and pulls the decoder output 150 low, thus completing the first cycle. When phase 99 (6 3/16) occurs, transistor P2 144 turns on pulling the decoder output 150 back high and when phase 143 occurs (8 15/16), transistor N2 148 turns on pulling the decoder output 150 low, thus completing the second cycle. An additional seven decoders (for a total of eight) can be added, each decoding a different set of four phases, thereby producing eight output waveforms. Each of the output waveforms is symmetric (i.e., has a 50% duty cycle). Thus, eight symmetric output waveforms, each phase shifted in time by 11 phases, as shown in FIG. 6B, are producible by this arrangement.

Figure 7A:
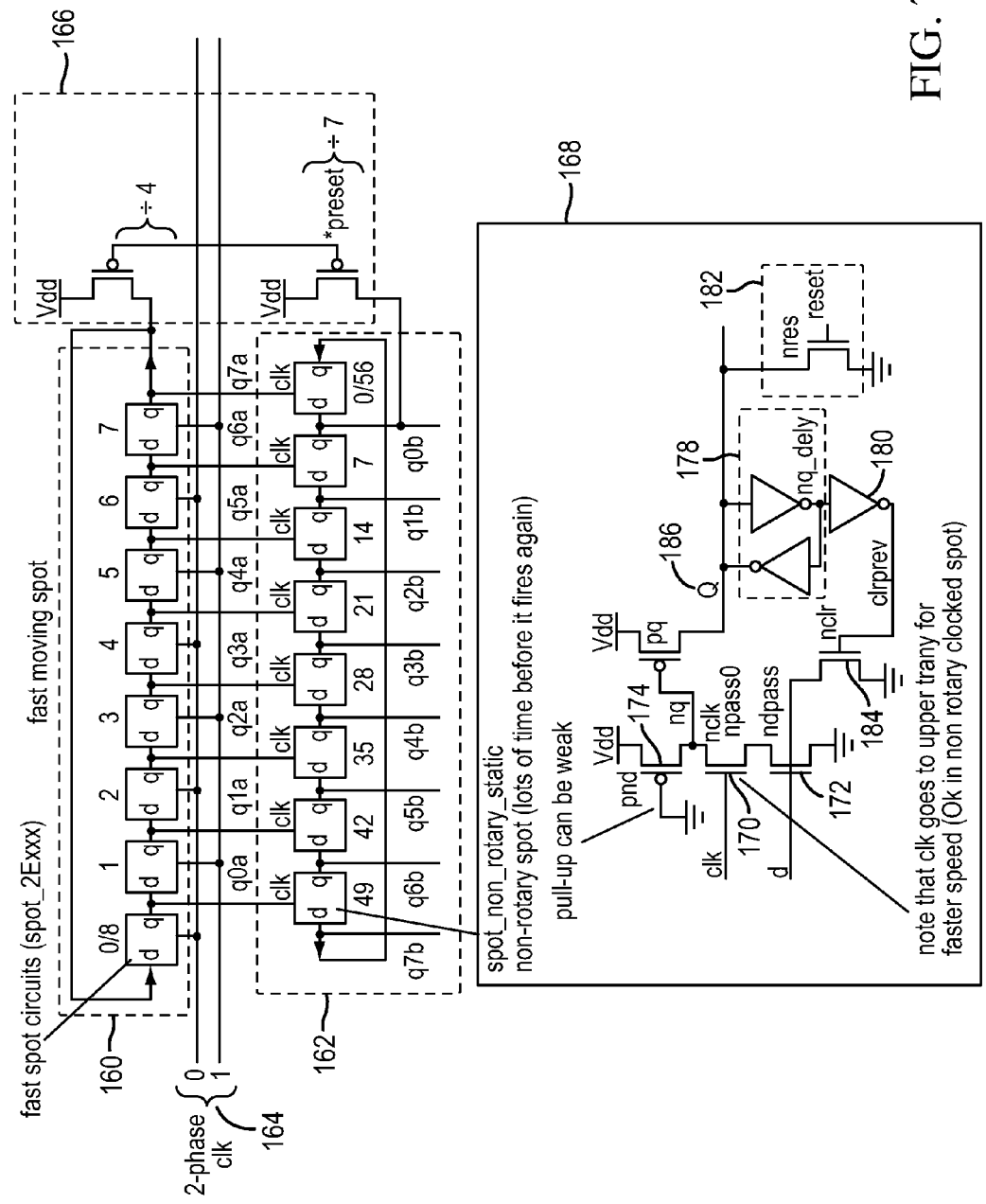
FIG. 7A shows a divide-by-28 function with an example of a static spot stage.

FIG. 7A shows a divide-by-28 function with an example of a static spot stage. The divide-by-28 function is performed in a two-stage contra-flow precession divider, wherein the first divider 160 rotates in a direction opposite to the second divider 162. The first divider 160 has 8 spot stages and advances the spot through all of the stages in 8 phases of a two-phase clock, thus implementing a divide-by-4. The second divider 162 has 8 spot stages and has the monotonic phase sequence of 0, 7, 14, 21, 28, 35, 42, 49, 56 (0), which indicates that the spot takes 56 phases of the first divider to advance through all of the stages of the divider. Because the first divider 160 takes 8 phases to advance through all of the stages, the second divider 162 implements a divide-by-7. Therefore, overall the divider ratio is 28 relative to the cycles of the two-phase clock 164. A pair of PMOS gates 166 are shown connected to the input of one of the stages of each of the dividers. These transistors 166 are used to initialize the spot in the divider. The static spot stage 168 in the drawing includes NMOS clk 170 and d 172 transistors, PMOS pullup 174 and output transistors 176, a flip-flop 178, an inverter 180, an NMOS reset transistor 182, and an NMOS clr transistor 184. The clk, d and PMOS pullup transistors 170, 172, 174 have their channels connected in series between Vdd and ground, with the clk input connected to the gate of the clk transistor 170 and d input connected the gate of the d transistor 172. The output transistor 176 has its gate connected to the junction of the clk transistor 170 and pullup transistor 174 and its channel connected between stage output node Q 186 and the supply voltage. The flip-flop 178 is connected to the stage output node 186 and the inverter 180 is connected between the flip-flop 178 and the NMOS clr transistor 184, whose channel is connected between the gate of the d transistor 172 and ground. In operation, when the clk input and d input are both high, indicating the presence of a spot in the previous stage and a clock signal for advancing the spot, the gate of the output transistor 176 is pulled towards ground, causing the stage output node Q 186 to go high. This, in turn, causes the flip-flop 178 to latch the high state on the output node 186 and the inverter 178 to drive a high on the gate of the clr transistor 184, thus turning it on. The clear transistor 184 removes the high on the gate of the d transistor 172, thereby removing the spot from the previous stage. The spot is now present in the current stage.

Figure 7B:
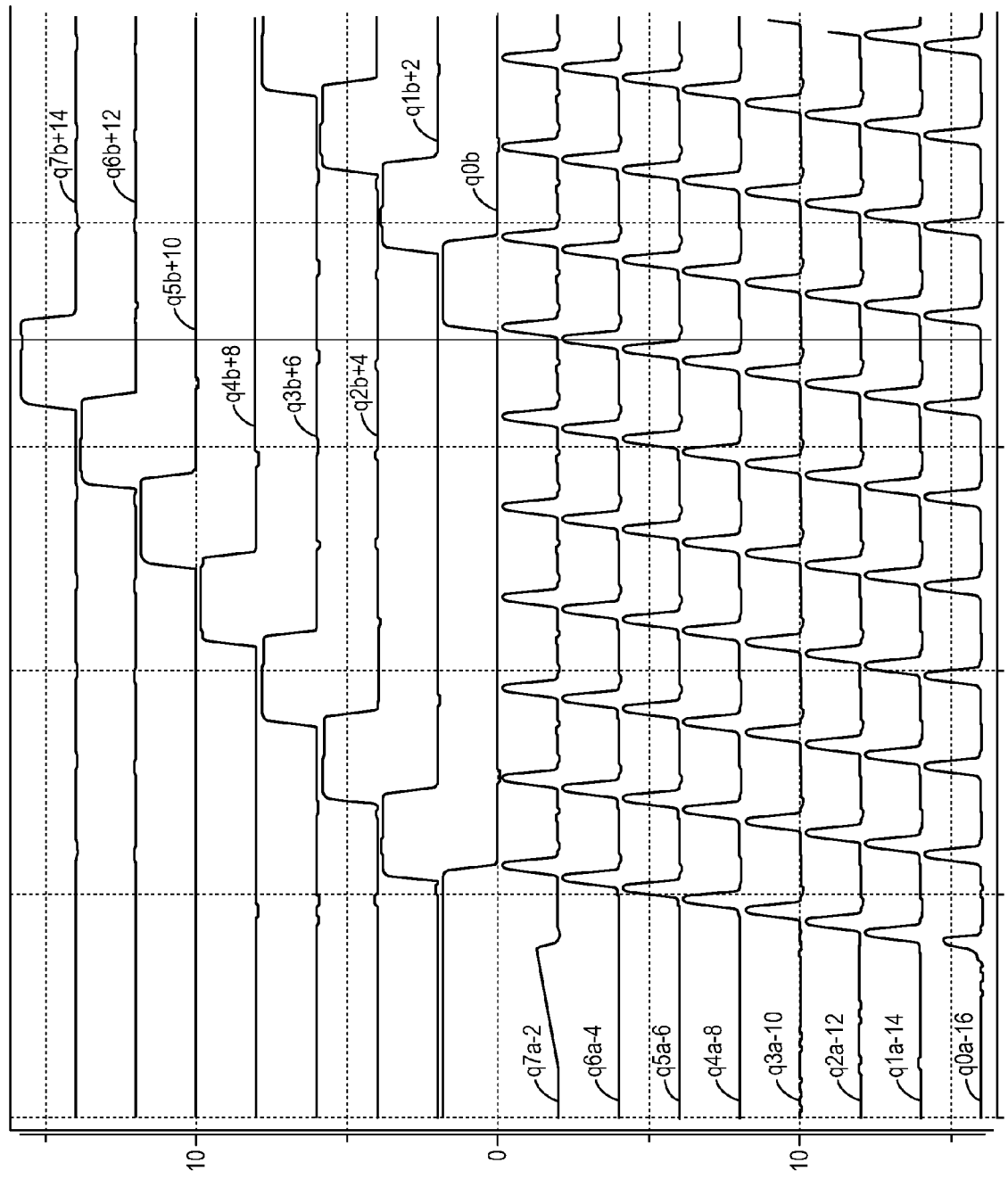
FIG. 7B shows a timing diagram for the divide-by-28 function of FIG. 7A.

FIG. 7B shows a timing diagram for the divide-by-28 function of FIG. 7A.

Use of One-Spot Divider with Sampler

Figures 8A, 8B:
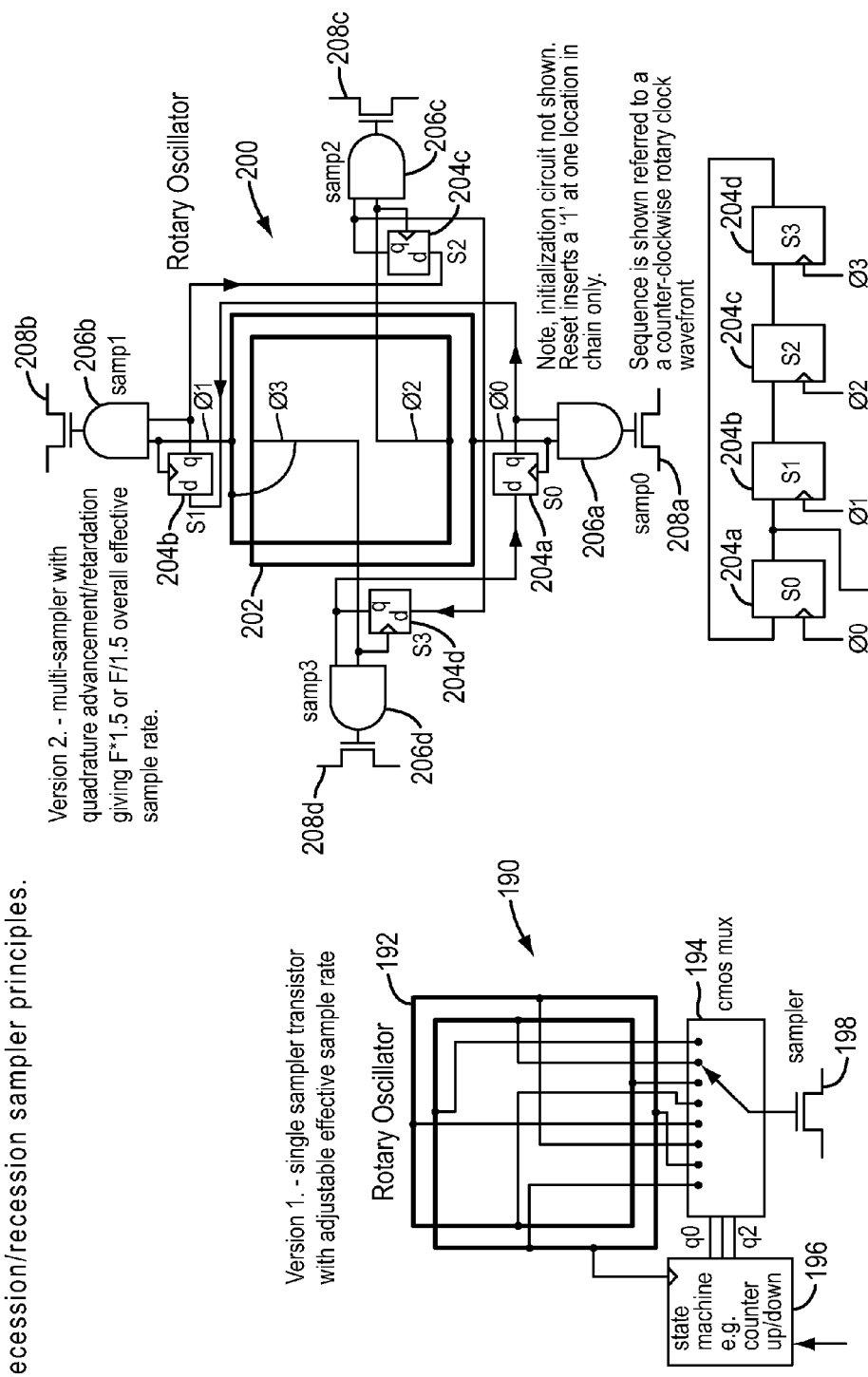
FIG. 8A shows a sampler with an adjustable sampling rate.
FIG. 8B shows a multi-sampler with a sampler rate that is adjustable up or down by a factor of 1.5.

FIG. 8A shows a sampler 190 with an adjustable sampling rate. The system 190 of FIG. 8A includes a rotary oscillator 192, a multiplexer 194 and a state machine 196, the combination of which is configured to select a spot for operating a sampling transistor in an analog-to-digital converter. In the system in FIG. 8A, a number (eight in the figure) of different tap points on the rotary oscillator 192 are selected for connection to the multiplexer inputs. The output of the multiplexer 194 is connected to the gate of the sampling transistor 198. The state machine 196 has a plurality (three in the figure) of outputs for selecting the multiplexer input that operates the gate of the sampling transistor 198. In effect, this arrangement provides discrete timing points from a rotary oscillator 192 that has a continuum of timing points.

FIG. 8B shows a multi-sampler 200 with a sampler rate that is adjustable up or down by a factor of 1.5. The system 200 in this figure includes a rotary oscillator 202, a ring of spot stages 204a-d, a number of decoding gates 206a-d ('AND' gates shown) and a plurality of sampling transistors 208a-d. The rotary oscillator 202 is presumed to rotate counter-clockwise, such that the phase sequence is $\phi 0, \phi 1, \phi 2, \phi 3$. However, the connections to the spot ring have the phase order of 0, 3, 2, 1, giving a monotonic phase sequence of 0, 3, 6, 9, 12(0). This phase sequence yield a divide-by-3 function, because it takes 12 phases of the four phase clock to advance the spot through the four stages. With four sampling transistors 208a-d, the effective sampling rate is 4 * F/3=F*1.33. If the spot stages have a sufficient delay, it is possible to implement a monotonic phase sequence of 0, 6, 12, 18, 24 (0), thereby implementing a divide-by-6 function (i.e., F/6), because it takes 24 phases of the four-phase input clock to advance the spot through all of the stages in the ring. With four sampling transistors 208a-d, the effective sampling rate is 4 * F/6=F/1.5. The result is a sampling period that is some fraction (i.e., 1.5) greater or slower than the rotary clock period.

R/2R Interpolator

Figure 9A:
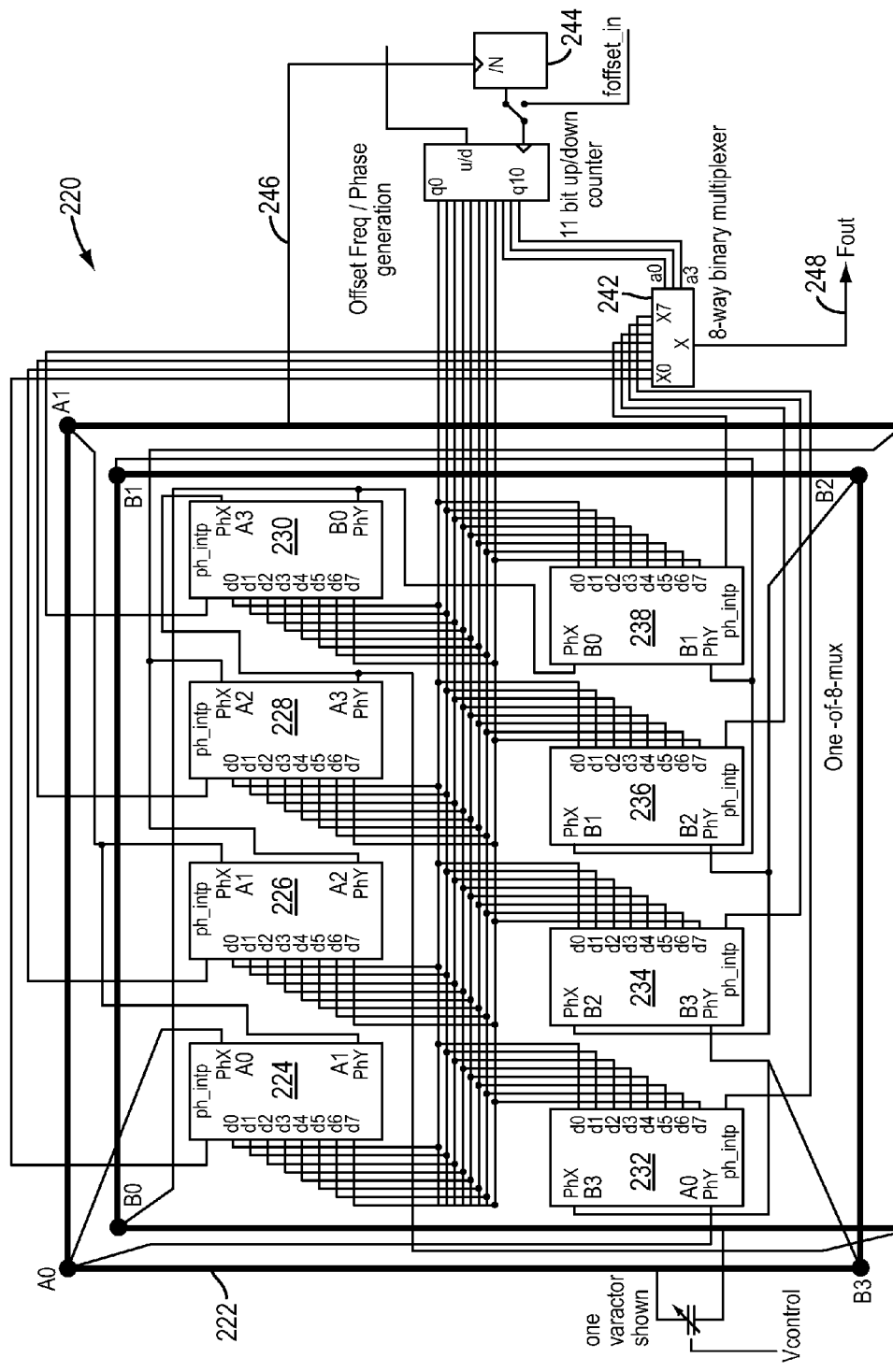
FIGS. 9A-9C show a system for interpolating between phases of a rotary clock to obtain finer phase accuracy.
Figure 9B:
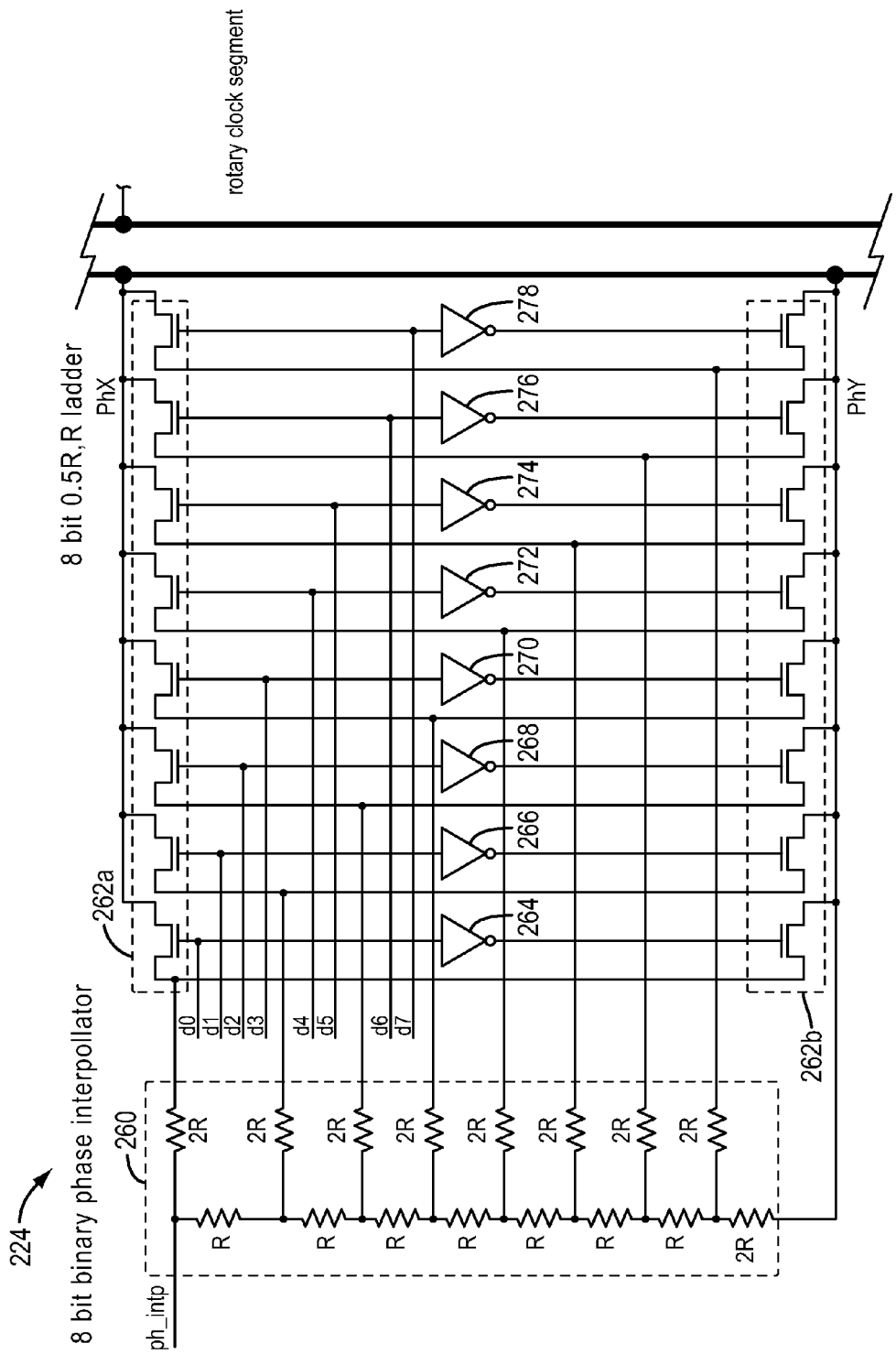
Figure 9C:
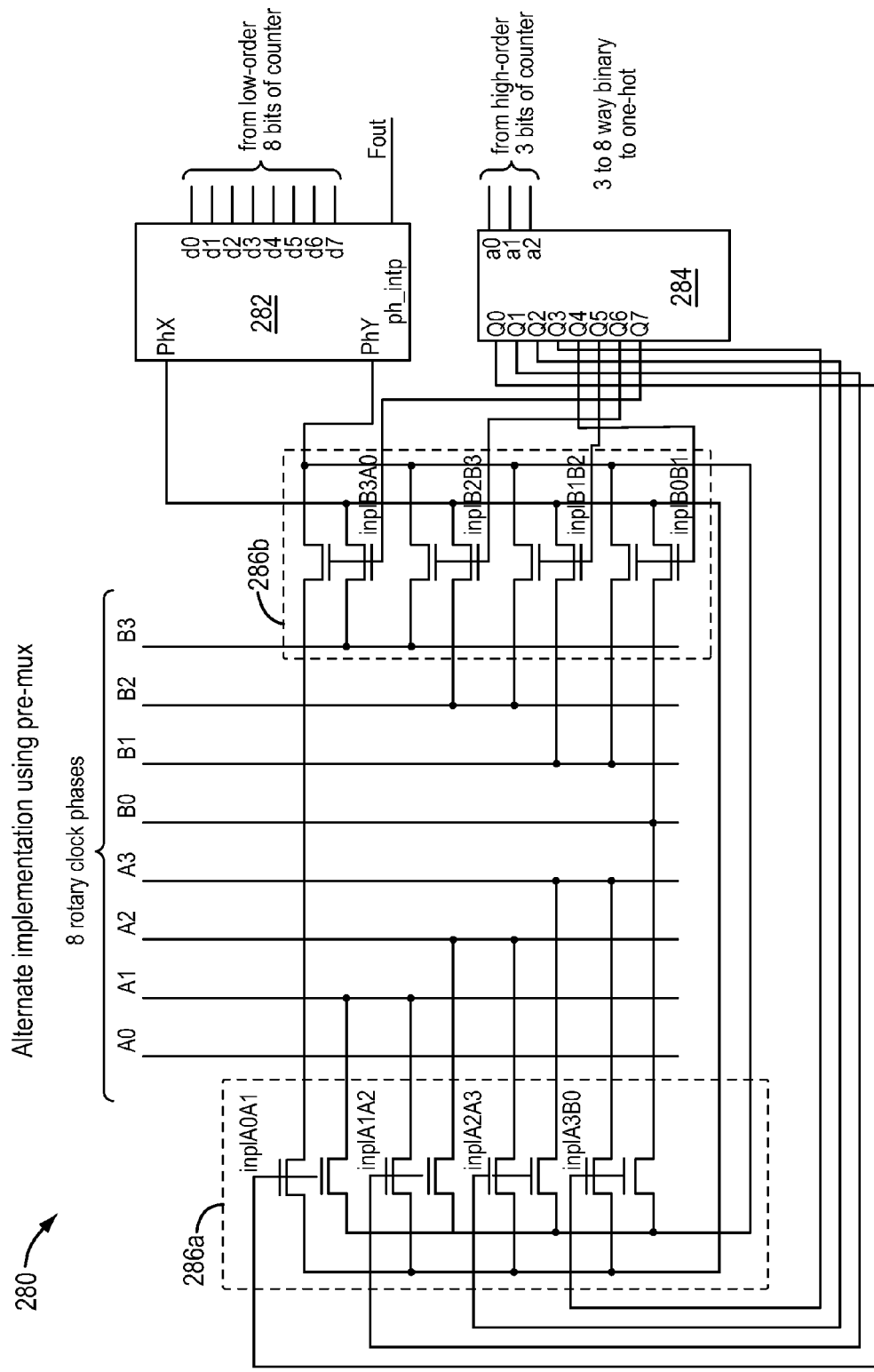

FIGS. 9A-9C show a system 220 for interpolating between phases of a rotary clock to obtain finer phase accuracy. Included in the system 220 are a rotary oscillator 222, a plurality of phase interpolators 224-238, one for each pair of phases between which interpolation is desired, a counter 240 with enough output bits to provide a sufficient number of interpolation steps between the phases being interpolated, a multiplexer 242 for selecting the interpolated output, and a frequency divider 244 operating from a phase 246 of the rotary oscillator 222. In the figure, there are eight phase interpolators 224-238 and eight pairs of phases, from the rotary oscillator 222, on which the interpolators operate, an eleven bit up/down counter 240, eight bits of which operate the phase interpolators and 3 bits of which operate the multiplexer 242 that selects the final output 248.

In operation, if the system were to progress through all of the phases possible, the counter 240 starts at zero, the three upper bits selecting the A0/A1 224 interpolator for output and the eight lower bits determining the interpolated phase, which can be one of eight phases including A0 and A1. With the counter 240 at zero, phase A0 is the interpolated phase. As the counter counts up, the A0/A1 interpolator 224 steps through each of eight interpolated phases, finally reaching phase A1. At this point, the counter 240 increments the three upper bits by one and now the A1/A2 interpolator 226 is selected. Again the counter counts up, causing the A1/A2 interpolator 226 to step through its eight phases. If the counter 240 continues to count up, the output FOUT 248, progressively moves through 64 phases, eight phases for each of the eight interpolators.

FIG. 9B shows an 8-bit binary phase interpolator 224-238 based on an R/2R ladder. This interpolator 224 includes the R/2R ladder 260, sixteen phase selection transistors 262a-b, and eight inverters 264-278. Eight of the phase selection 262a transistors are connected to PhX and eight 262b are connected to PhY. A code, such as a binary code or a thermometer code, is received by the inverters 264-278 and determines which of the phase selection transistors 262a-b is on. An "all-zeros" code causes all of the phase selection transistors connected to PhY (262b) to be on and all of the phase selection transistors connected to PhX (262a) to be off. The result is that PhY is provided on the output with an effective resistance of R. An "all-ones" code causes all of the phase selection transistors connected to PhX (262a) to be on and those connected to PhY (262b) to be off. The result is that PhX is provided (actually, a voltage slightly less) on the output with an effective resistance of R. A code that is between the "all zeros" code and the "all ones" code turns on some of the transistors connected to PhX and some connected to PhY so that the output phase lies between PhX and PhY, according to the code. Other options include the use of a C/2C ladder network and a fully/partially thermometer coded DAC.

FIG. 9C shows an alternative implementation 280 of the system in FIG. 9A. In this implementation, only one interpolator 282 is used in combination with a 3-to-8 way binary to one-hot converter 284, a plurality of phase selection transistors 286a,b, and an 11-bit counter (only outputs shown). The one-hot converter 284 converts the upper three bits of the counter to a one-hot code to select a pair of phases for interpolation via the phase selection transistors 286a,b. There are 16 pairs of phase between which an interpolation can occur. The selected pair of phases is forwarded to the phase interpolator 282 which uses the lower eight bits of the counter to determine the final output phase. Thus, an all zero output of the counter selects phases A0/A1 for interpolation, the upper 3 bits controlling the one-hot converter and the lower eight bits determining the phase between A0/A1 for output. An R/2R DAC can be used to interpolate to 8 bits ($2^8$) or more accuracy between rotary clock phases. With 16 ($2^4$) phases to interpolate between, this becomes 12 bits ($2^{12}$) of phase resolution, i.e., 30 fS of precession/recession per cycle. Capacitive DACs can also be used.

Figure 9D:
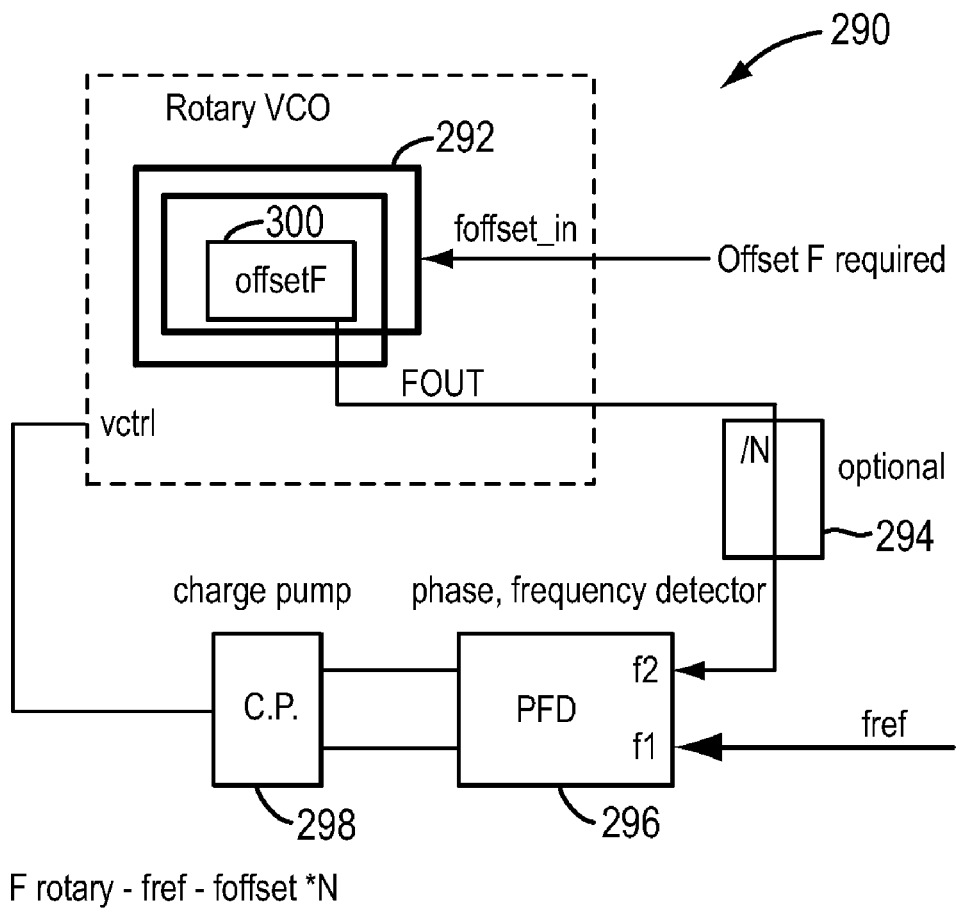
FIG. 9D shows a phase-locked loop system with an interpolator in the feedback path.

FIG. 9D shows a phase locked loop system 290 which includes a voltage-controlled rotary clock oscillator 292, an optional frequency divider 294, a phase/frequency comparator 296 and a charge pump 298. The output of the voltage controlled rotary clock oscillator 292 FOUT is fed to a divider 294, such as a moving spot divider described above. The output of the moving spot divider and a frequency reference are compared in the phase/frequency detector 296, which drives the charge pump 298 up or down, depending on the direction of the phase difference. The output of the charge pump 298 controls the frequency and phase of the rotary clock oscillator 292. Also included in the feedback path, between the oscillator output and the frequency divider, is an interpolator 300, such as the interpolator described above. The insertion of the interpolator 300 causes the rotary oscillator to run at a fractional of N frequency when in lock. The circuit adds or subtracts frequencies from the PLL feedback path causing the PLL to lock the rotary clock cleanly to a different non-integer frequency (the PLL locks the output of the interpolator to Fref (F2=F1 in the PLL)), but because a frequency is added or subtracted by the interpolating precession circuit, the rotary clock frequency has to be a locked to a little higher or lower frequency. Multiple frequency synthesizer circuits can be added to one rotary clock to have auxiliary outputs at different frequency and phase relationships. This circuit eliminates the need to design a fractional-N PLL. All that is needed is an integer N PLL to which the interpolator can be added to obtain the fractional divide. The advantage of this circuit is that arbitrary frequencies can be synthesized with no added phase noise.

As an example, assume Fref=100 MHz, and that the divider 294 in the loop is a divide-by-32 i.e., /N=/32. In the nominal case with no interpolator 300, the rotary oscillator 292 runs at 3.2 GHz, which when divided by 32, matches the reference frequency. If it is desired that the rotary oscillator have a frequency of 3.456 GHz, (where the divide ratio is 34.457), then the interpolator 300 is placed in the feedback loop to provide the 0.2567 GHz difference. If the interpolator is being clocked with a divide-by-2 divider, such as the spot divider described above, then the counter is operating the interpolator at a rate 1.72835 GHz. This frequency is 6.733 times faster than the frequency difference of 0.2567 GHz needed to get the rotary oscillator to operate at the frequency of 3.4567 GHz. By having the interpolator move 53.4 degrees (360/6.733) for each step, the desired frequency of the rotary oscillator is obtained. Thus, taps are chosen on the rotary oscillator so that the interpolator changes 53.4 degrees each time the counter operating the control inputs of the interpolator is changed; after a total of 6.733 steps of the interpolator the frequency of the rotary oscillator changes by 0.2567 GHz. Though the numerical example illustrates the effect of the interpolator, the implementation is not direct. In practice, the implementation includes a coarse adjustment using an integer divider and fine tuning using offset from the interpolator.

Using the interpolated signal as the feedback in a PLL helps in the following ways. First, the rotary oscillator 292 itself is locked to Fref*N±offset. Any interpolator noise is filtered in the PLL loop filter to some extent, because the output of the charge-pump integrates multiple phase errors before feeding back to the rotary oscillator control voltage. The rotary clock is stronger, has lower phase noise, and is inherently multi-phase (compared to the output of the interpolator). A disadvantage of using the interpolator in the feedback loop is the response time of changing frequencies (have to wait for the PLL loop lock-in time), whereas an open-loop interpolated output can be adjusted instantaneously in phase and frequency (i.e., is frequency agile).

Figure 10:
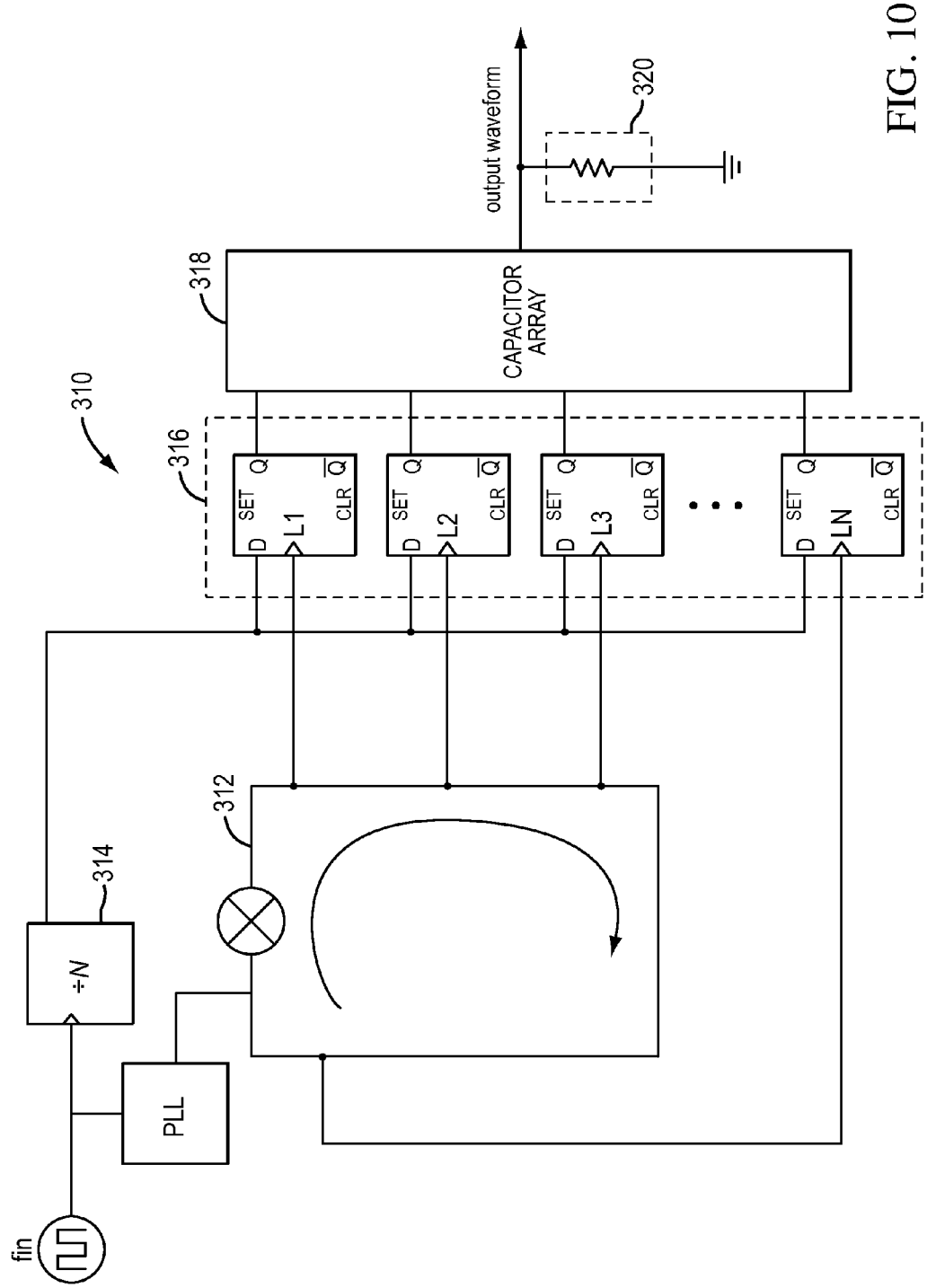
FIG. 10 shows an alternative means for creating a lower frequency waveform.

FIG. 10 shows an alternative means 310 for creating a lower frequency waveform. The embodiment includes a rotary clock 312, a divide-by-N circuit 314, a plurality of flip-flops 316, a capacitor array 318, and an optional load device 320. The rotary clock 312 provides a plurality of phases to the flip-flops 316 (only some of which are shown). The flip-flops 316 receive the phases of the rotary clock on the clock input and the output of the divide-by-N circuit 314 on the D input. The outputs of the plurality of flip-flops 316 are provided to the capacitor array 318 whose elements are chosen for the desired synthesized waveform. The frequency of the synthesized waveform is the input frequency divided by N. Optionally, a load device 320 may be connected to the output of the capacitor array to smooth the output.

Figure 11:
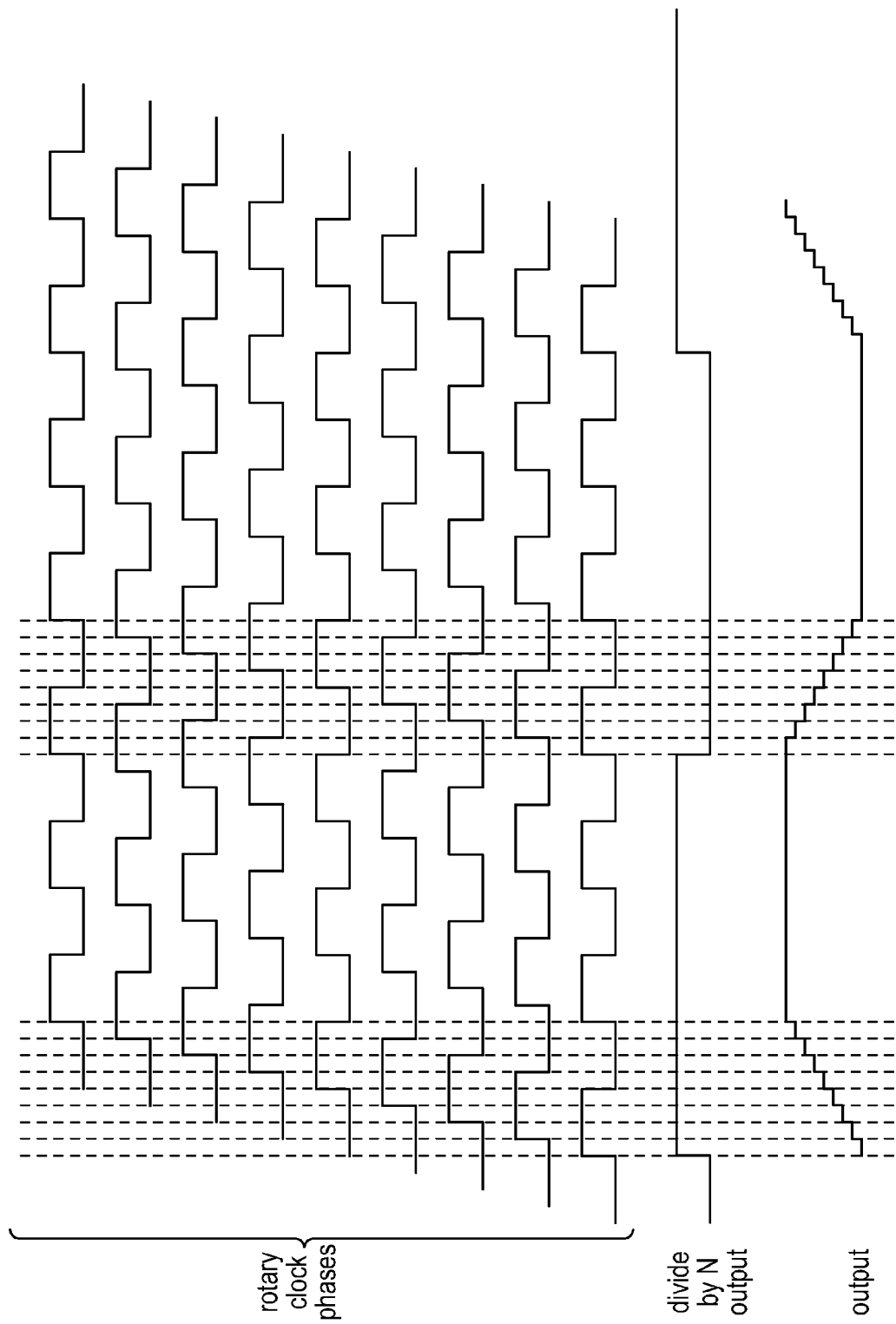
FIG. 11 shows the waveform for the case of a divide-by-six of the input clock.

FIG. 11 shows the waveforms for the case of a divide-by-six of the input clock. There are eight phases of the rotary clock available. This permits the synthesized waveform to have the controlled transitions times and the frequency shown.

Referring to FIGS. 10 and 11, in operation, during the high time of the divide-by-N output, the eight phases of the rotary clock are used to synthesize the transition of the output waveform. As shown in FIG. 11, the transition occurs during the first cycle of the rotary clock. If it is desired that the transition of the output waveform occur for additional cycles of the rotary clock, then a counter or shift register can be used to count the cycles needed and provide the extra control logic.

Figure 12:
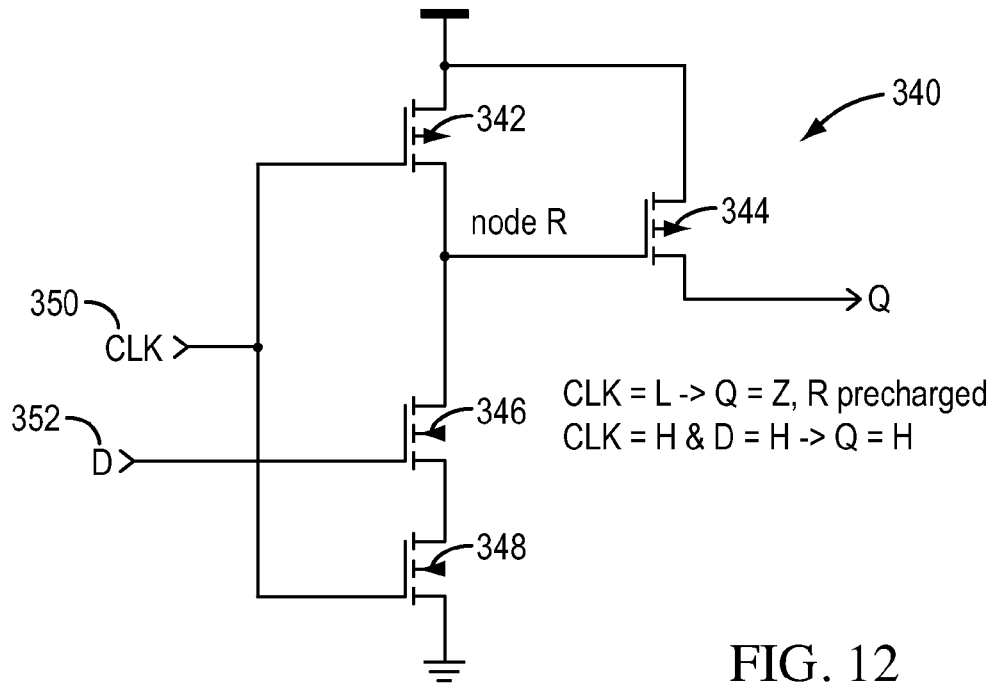
FIG. 12 shows a typical latch for use in the divider.

FIG. 12 shows a typical latch 340 for use in the divider. It includes first 342 and second 344 PMOS transistors and first 346 and second 348 NMOS transistors. When the clock input CLK 350 is low, node R is precharged and the Q output is in the high impedance state, because the second PMOS transistor 344 is off. When the clock input CLK 350 is high, and D is high, node R is pulled low, and the second PMOS transistor 344 is turned on, pulling Q high. If the CLK is high and D is low, then the Q output stays at its previous state.

Figure 13:
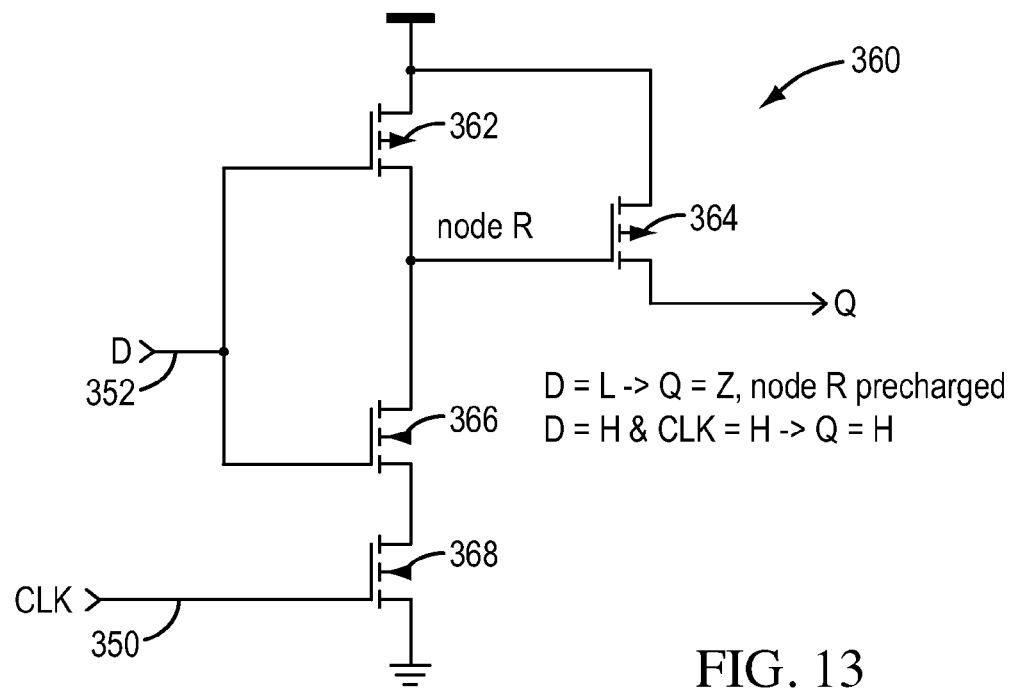
FIG. 13 shows an improved latch structure.

FIG. 13 shows an improved configuration 360. In this device, there are again two PMOS transistors 362, 364 and two NMOS transistors 366, 368. One of the PMOS transistors and one of the NMOS transistors 362, 366 form an inverter structure for the D input 352. The second NMOS transistor 368 has its channel connected between the inverter structure and ground and its gate connected to the clock input 350. The second PMOS transistor 364 has its channel connected between the supply node and the output and its gate connected to the output node of the inverter structure 362, 366, thereby inverting the output of the inverter structure when the output is low. In this configuration, the D input going low precharges node R without qualification. When the clock input CLK 350 is high and the D input 352 is high, node R is discharged and the Q output is driven high. Otherwise, the Q output stays at its previous state.

Figure 14:
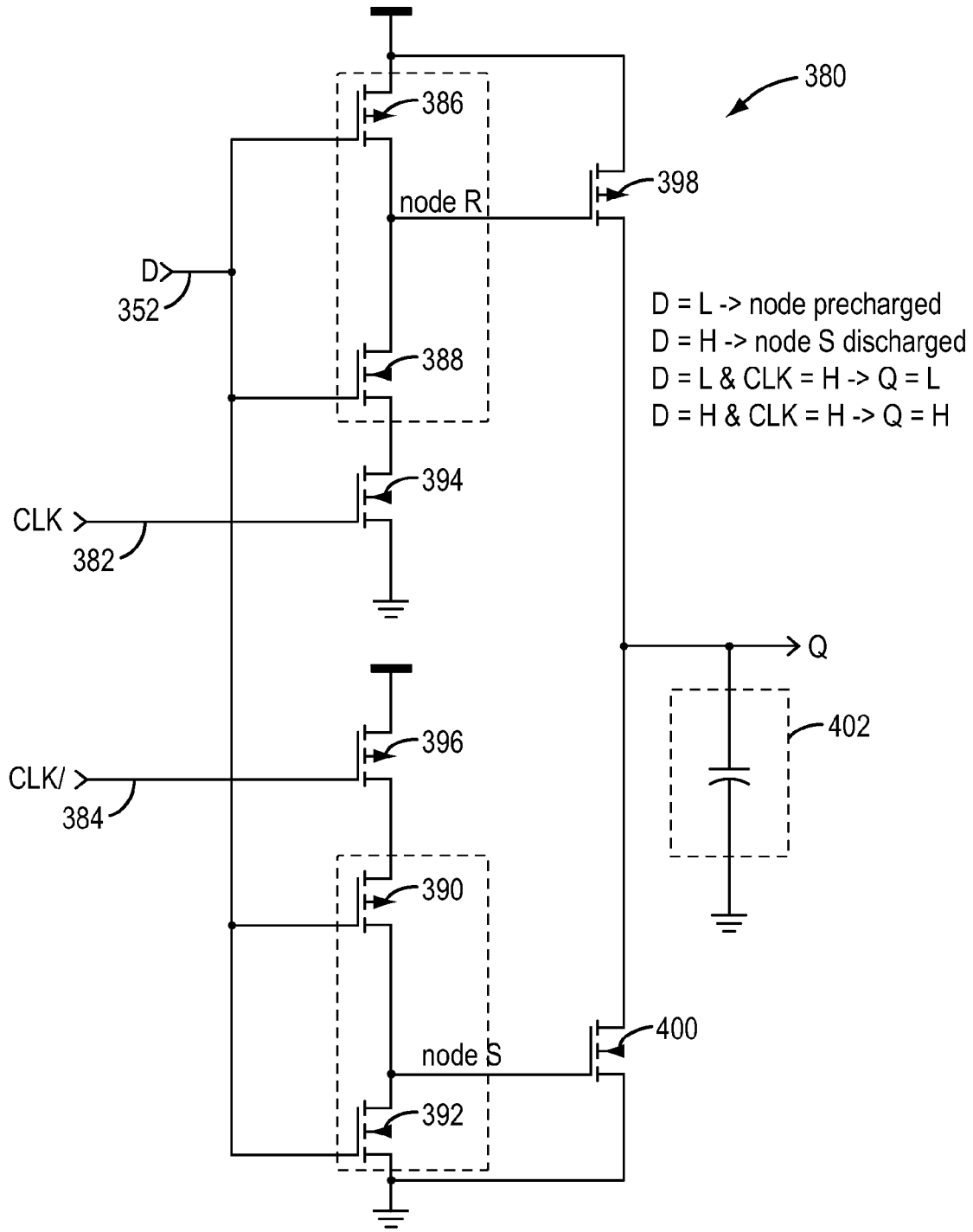
FIG. 14 shows an improved structure that operates using clock CLK and the inverted clock CLK/.

FIG. 14 shows another improved structure 380 that operates using clock CLK 382 and the inverted clock CLK/ 384. It includes a first inverter structure 386, 388 and a second inverter structure 390, 392 for the D input. The channel of the transistor 394 connected to the CLK input is connected between the first inverter structure 386, 388 and ground to enable the first inverter structure 386, 388. The channel of the transistor 396 connected to the CLK/ 384 input is connected between the second inverter structure 390, 392 and the supply to enable the second inverter structure 390, 392. An output-PMOS transistor 398 has its channel connected between the Q-output and supply and an output-NMOS transistor 400 has its channel connected between the Q-output and ground. In operation, when the D input goes low, the R node is precharged without qualification and when the D input 352 goes high, the S node is pre-discharged without qualification. When the CLK input 382 is high and D 352 is high, the first inverter structure 386, 388 is enabled and outputs a low causing the Q output to be driven high. When the CLK input 382 is high and the D input 352 is low, the second inverter structure 390, 392 is enabled and outputs a high causing the Q output to be driven low. Note that any change on the D input 352 guarantees that both the R node and the S node are precharged and pre-discharged, respectively, thus preventing the transistors 398, 400 driving the Q output from being on, when the clock is low. Thus, the Q output is only driven when the clock is high.

In the operation of the present invention, the structure of FIG. 14 behaves like a latch. When the CLK input 384 is high, the Q output follows the D input 352 and the device guarantees that only one of the transistors connected to the Q output is on. When the CLK input is high 382 and the Q output is following the D input, the transistor not driving the Q output is guaranteed to be turned off. When the CLK input is low, any changes on the D input cause both transistors connected to the Q output to be off.

Figure 15:
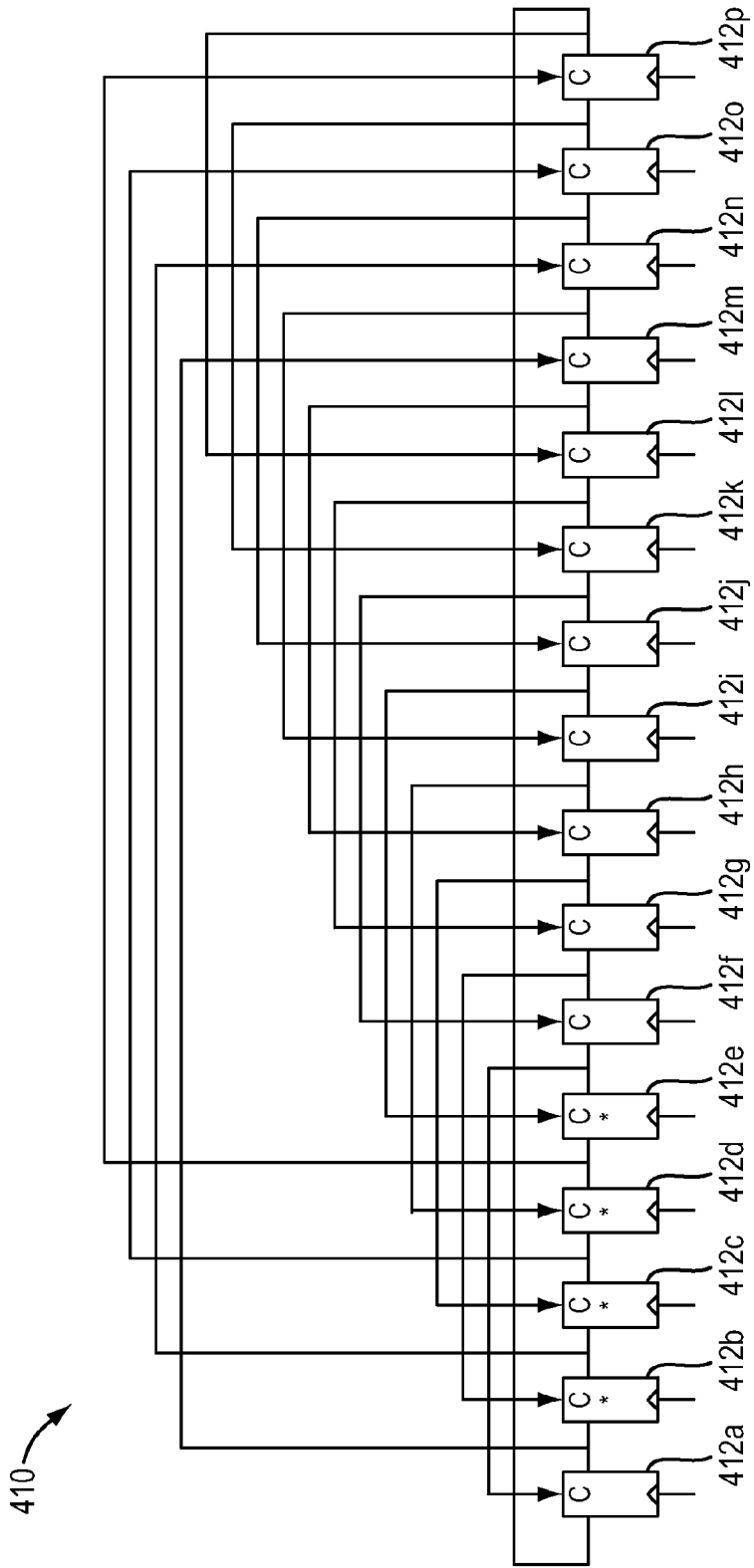
FIG. 15 shows an extended spot divider.

FIG. 15 shows an extended spot divider 410. In this type of divider, instead of only one stage carrying the "one" or spot, a group of stages carries an "extended spot." For example, if a ring has sixteen stages 412*a-p*, four of the stages 412*b-e* can carry the "one" or spot. This extended spot (stored in 412*b-e*) then moves as a group stage-by-stage through the ring. The divider ratio of the ring does not change because it takes the same number of phases to advance extended spot through all of the stages in the ring. The difference between an extended spot divider and a single spot divider is that each stage must not clear the previous adjacent stage but instead clear the stage adjacent to the last spot of the group. Thus, as shown in FIG. 15, if the extended spot is four stages 412b-e, then the stage at the front of the group must clear the stage behind the last stage of the group and this is true for each stage of the ring.

Figure 16A:
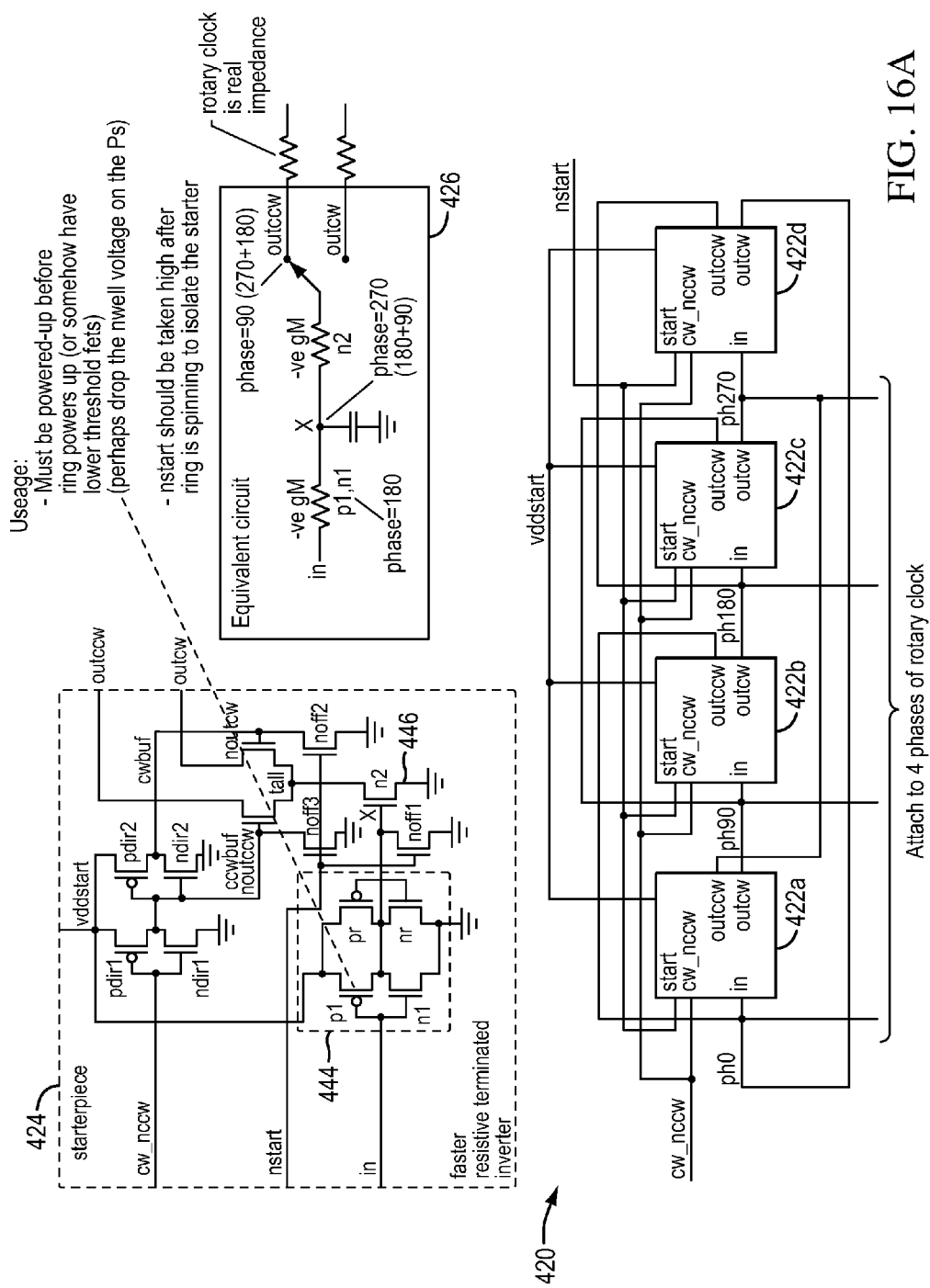
FIGS. 16A and 16B show circuitry for starting the rotation of a rotary oscillator.
Figure 16B:
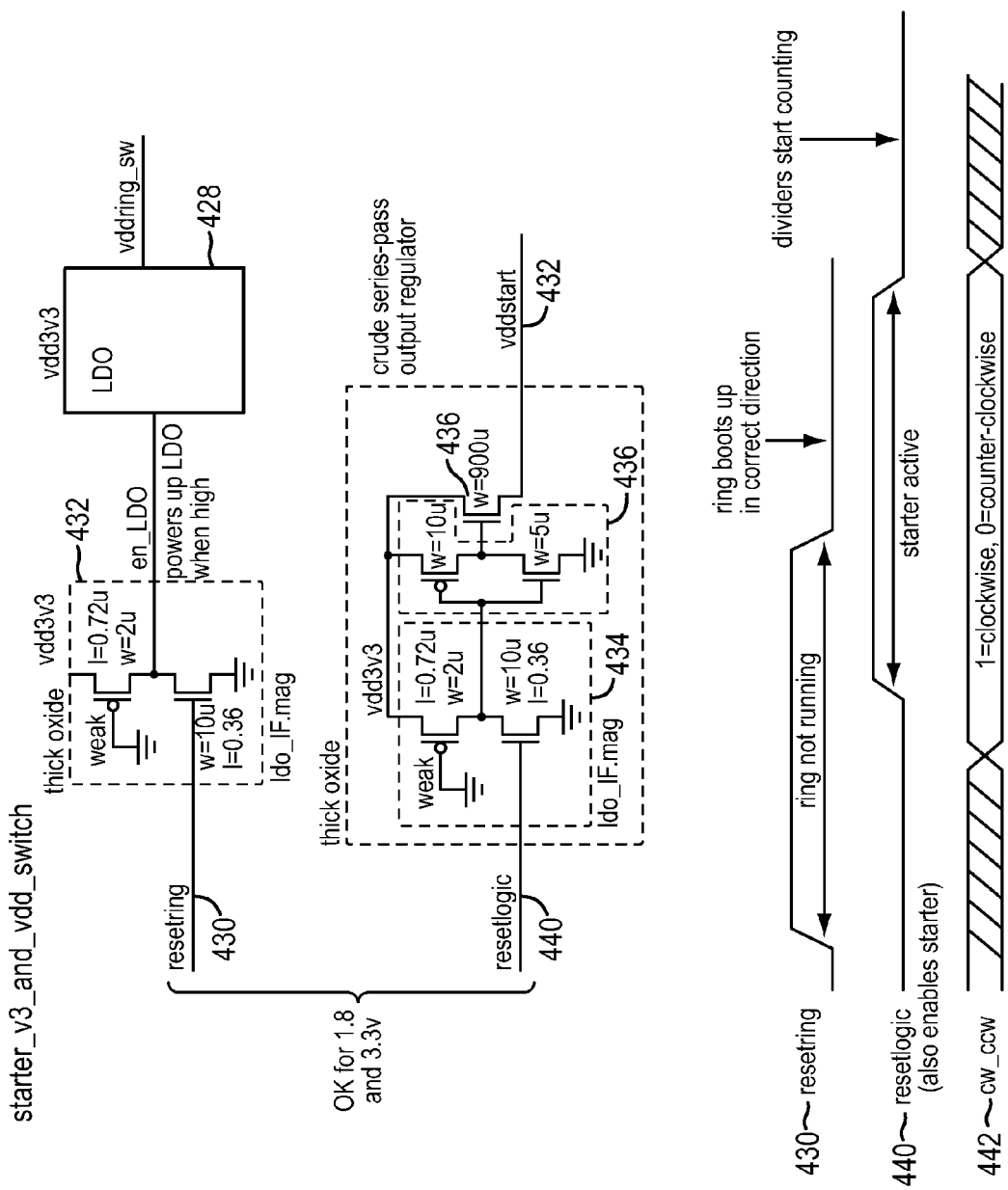

As mentioned above, different divider ratios are possible depending on the direction of the multi-phase clock that drives the moving spot divider. For example, if there is a 10-stage ring driven by a four-phase clock with the monotonic phase sequence 0 1 3 4 6 7 9 10 12 13 15 16 18 19 21 22 24(0) a divide-by-six is implemented because it takes 24 phases of the four-phase clock to advance the spot through all of the stages. However, if the multi-phase clock has its direction reversed, then the monotonic phase sequence 0 3 5 8 10 13 15 18 20 23 25 28 30 33 35 38 40(0) resulting in a divide-by-10 (because it takes 40 phases of the four-phase clock to move the spot through all of the stages). As a result it is important that the rotation direction of the multi-phase oscillator be controllable so that these different divider ratios can be implemented. FIGS. 16A and 16B show circuitry 420 for realizing this. The circuitry includes, in the embodiment shown, four stages 422a-d in a starter circuit that is attached directly to the clocks (ph0, ph90, ph180, ph270) of the multi-phase oscillator, which is assumed to be a rotary traveling wave oscillator. Each of the stages in the starter circuit includes a 90 degree phase shifting circuit 424, whose equivalent 426 is shown in the inset. The starter circuit 420 is connected to the rotary oscillator such that the direction of rotation can be chosen, at startup, to be either clockwise or counter clockwise. Thus, in the first stage 422a of the starter circuit 420, the input is ph0 and the output is either ph90 for clockwise or ph270 for counter clockwise. For the second stage 422b, the input is ph90 and the output is either ph180 for clockwise or ph0 for counter clockwise. For the third stage 422c, the input is ph180 and the output is either ph270 for clockwise or ph90 for counter clockwise. For the fourth stage 422d, the input is ph270 and the output is either ph0 or ph180 for counter clockwise. Each stage has an input cw_nccw for selecting the direction of rotation of the rotary oscillator. The input nstart is used to enable the operation of the stage and the connection vddstart provides power to each of the stages.

A low drop out regulator (LDO) 428, shown in FIG. 16B, provides power to the rotary oscillator and this regulator is enabled to operate by the resetring signal 430 via an inverter 432. The signal vddstart 432 is driven from a pair of inverters 434, 436 and a source follower 438, the first inverter of which has the resetlogic signal 440 as its input.

The starter circuitry 420 operates as follows. First, the resetring signal 430 is made active. This powers down the LDO 428 and therefore, the rotary oscillator. While the resetring signal 430 is active, the resetlogic signal 440 is made active along with the direction signal cw_ccw 442. This powers up the source follower 436 to provide power to the starter circuit and set the direction. However, at this point, all of the phase signals from the rotary oscillator are inactive. Next, the rotary oscillator is powered up via the LDO 428. This causes the starter circuit to urge the 90 degree phase shifts in each stage between input and output signals of that stage. Thus, in the clockwise direction, a 90 degree phase shift is urged between the ph0 and ph90 signals from the rotary oscillator, and similarly for the other stages. Once the rotary oscillator begins operation in a particular direction, then starter circuit is powered down to save power.

Each stage 422a-d of the starter circuitry includes a first negative resistance device 444 (FIG. 16A) effectively connected to a capacitive load followed in series by a second negative resistance device 446. This gives a net of +90 degrees of phase shift for each stage. The first negative resistance device 444 is the pair of transistors p1, n1, which is biased by transistors pr and nr. The second negative resistance device 446 is transistor n2, an open drain output that is connected to the output switch which comprises transistors noutccw and noutcw.

Multiphase Oscillator

Known transmission-lines broadly fall into two categories in that they are either open-ended or specifically terminated either partially or fully. Transmission-lines as proposed herein are different in being neither terminated nor open-ended. They are not even unterminated as such term might be understood hitherto; and, as unterminated herein, are seen as constituting a structural aspect of invention, including by reason of affording a signal path exhibiting endless electromagnetic continuity.

Figure 17:
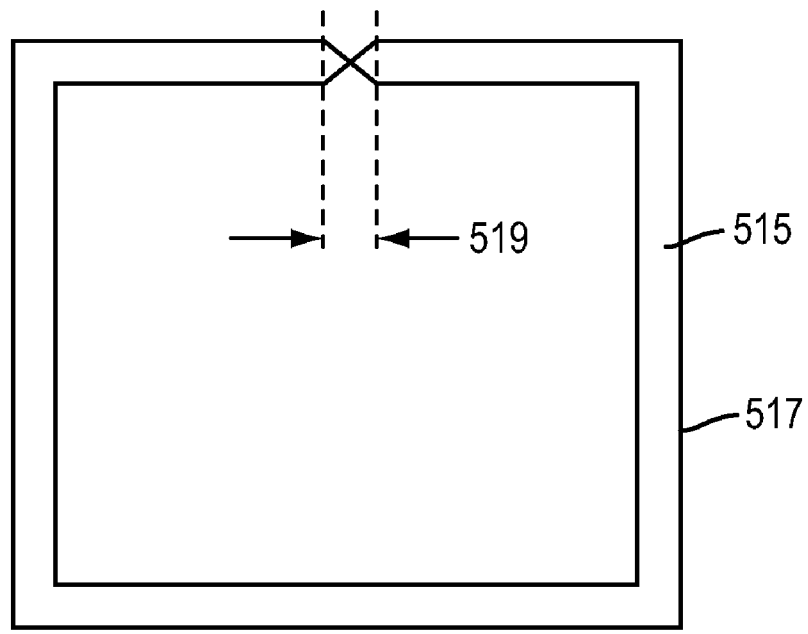
FIG. 17 is an outline diagram for a transmission-line structure hereof.

FIG. 17 shows such a transmission-line 515 as a structure that is further seen as physically endless, specifically comprising a single continuous "originating" conductor formation 17 shown forming two appropriately spaced generally parallel traces as loops 515a, 515b with a cross-over at 519 that does not involve any local electrical connection of the conductor 517. Herein, the length of the originating conductor 517 is taken as S, and corresponds to two laps' of the transmission-line 515 as defined between the spaced loop traces 515a, 515b and through the cross-over 519.

Figure 18:
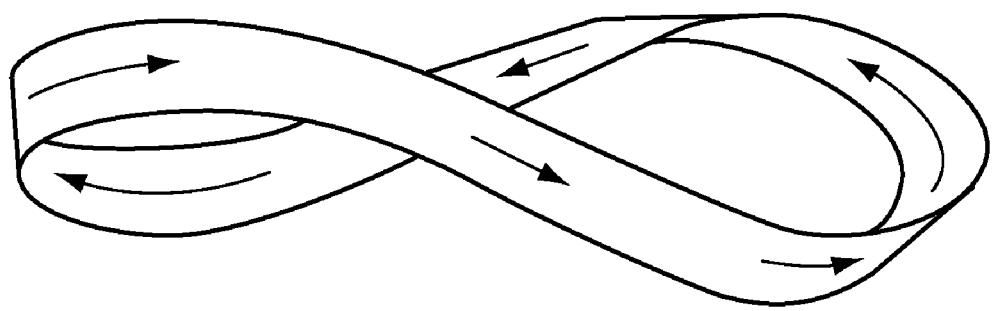
FIG. 18 shows a Moebius strip.

This structure of the transmission-line 515 has a planar equivalence to a Moebius strip, see FIG. 18, where an endless strip with a single twist through 180° has the remarkable topology of effectively converting a two-sided and two-edged, but twisted and ends-joined, originating strip to have only one side and one edge, see arrows endlessly tracking the centre line of the strip. From any position along the strip, return will be with originally left- and right-hand edges reversed, inverted or transposed. The same would be true for any odd number of such twists along the length of the strip. Such a strip of conductive material would perform as required for signal paths of embodiments of this invention, and constitutes another structural aspect of invention. A flexible substrate would allow implementing a true Mobius strip transmission-line structure, i.e. with graduality of twist that could be advantageous compared with planar equivalent cross-over 519. A flexible printed circuit board so formed and with its ICs mounted is seen as a feasible proposition.

Figure 19:
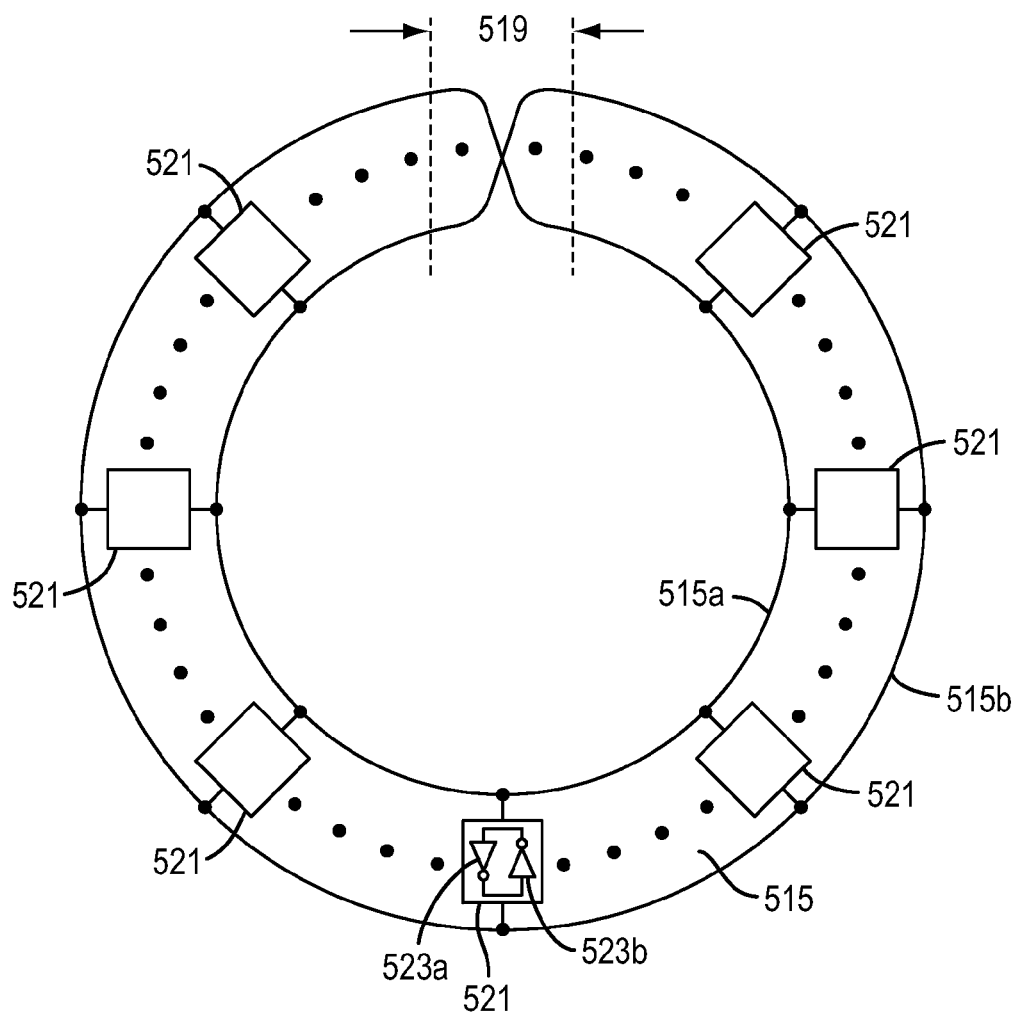
FIG. 19 is an outline circuit diagram for a traveling wave oscillator hereof.

FIG. 19 is a circuit diagram for a pulse generator, actually an oscillator, using the transmission-line 515 of FIG. 17, specifically further having plural spaced regenerative active means conveniently as bi-directional inverting switching/amplifying circuitry 521 connected between the conductive loop traces 515a, 515b. The circuitry 521 is further illustrated in this particular embodiment as comprising two inverters 523a, 523b that are connected back-to-back. Alternatives regenerative means that rely on negative resistance, negative capacitance or are otherwise suitably non-linear, and regenerative (such as Gunn diodes) or are of transmission-line nature. It is preferred that the circuitry 521 is plural and distributed along the transmission-line 515, further preferably evenly, or substantially evenly; also in large numbers say up to 100 or more, further preferably as many and each as small as reasonably practical.

Inverters 523a, 523b of each switching amplifier 521 will have the usual operative connections to relatively positive and negative supply rails, usually V+ and GND, respectively. Respective input/output terminals of each circuit 21 are shown connected to the transmission-line 15 between the loops 515a, 515b at substantially maximum spacing apart along the effectively single conductor 517, thus each at substantially halfway around the transmission-line 515 relative to the other.

Figure 20:
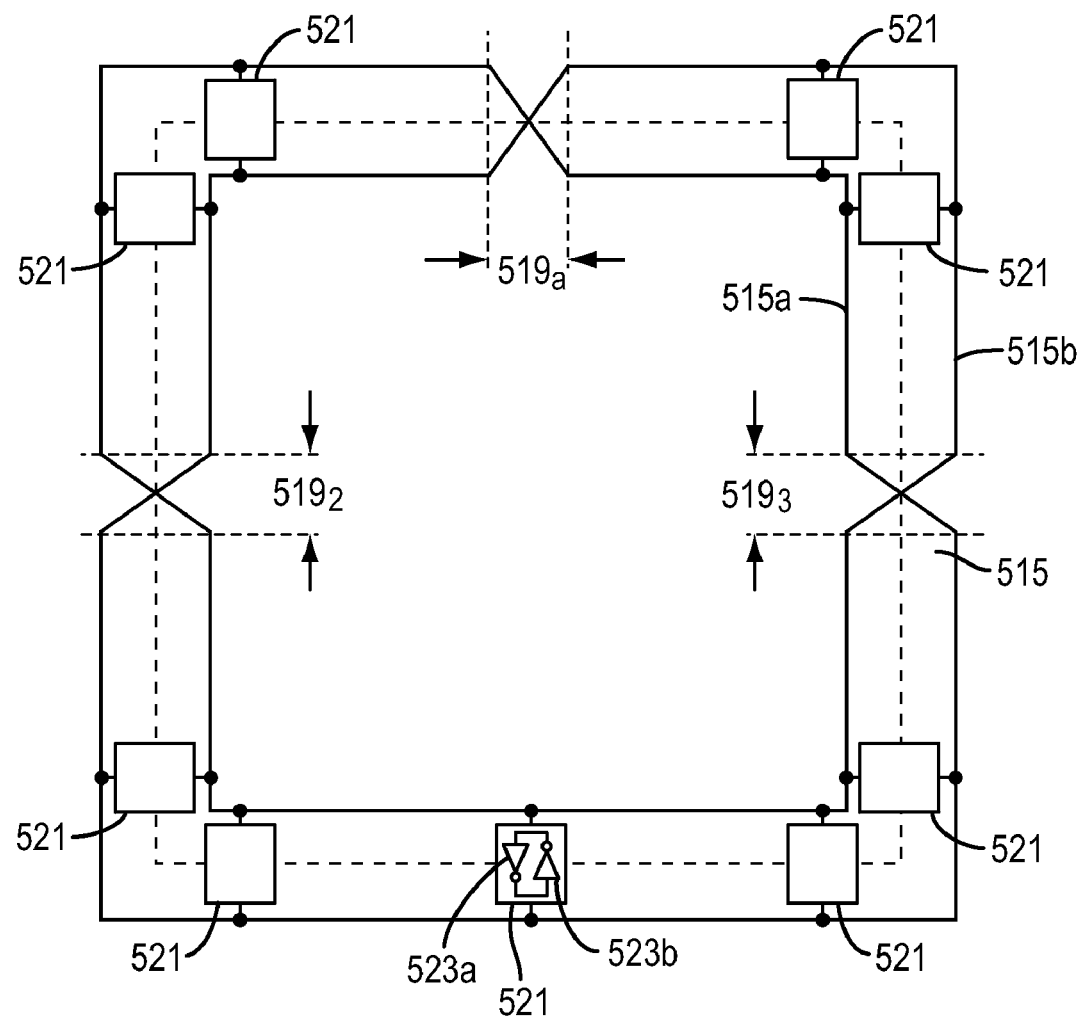
FIG. 20 is another outline circuit diagram for a traveling wave oscillator hereof.

FIG. 20 is another circuit diagram for an oscillator using a transmission-line structure hereof, but with three cross-overs 519a, 519b and 519c, thus the same Moebius strip-like reversing/inverting/transposing property as applies in FIG. 19.

The rectangular and circular shapes shown for the transmission-line 515 are for convenience of illustration. They can be any shape, including geometrically irregular, so long as they have a length appropriate to the desired operating frequency, i.e. so that a signal leaving an amplifier 521 arrives back inverted after a full 'lap' of the transmission-line 515, i.e. effectively the spacing between the loops 515a,b plus the crossover 519, traversed in a time Tp effectively defining a pulse width or half-cycle oscillation time of the operating frequency.

Advantages of evenly distributing the amplifiers 521 along the transmission-line 515 are twofold. Firstly, spreading stray capacitance effectively lumped at associated amplifiers 521 for better and easier absorbing into the transmission-line characteristic impedance Zo thus reducing and signal reflection effects and improving poor waveshape definition. Secondly, the signal amplitude determined by the supply voltages V+ and GND will be more substantially constant over the entire transmission-line 515 better to compensate for losses associated with the transmission-lines dielectric and conductor materials. A continuous closed-loop transmission-line 515 with regenerative switching means 521 substantially evenly distributed and connected can closely resemble a substantially uniform structure that appears the same at any point.

A good rule is for elementary capacitance and inductance (Ce and Le) associated with each regenerative switching means and forming a resonant shunt tank LC circuit to have a resonant frequency of $1/(2\pi\sqrt{L_e C_e})$ that is greater than the self-sustaining oscillating frequency F (F3, F5 etc.) of the transmission-line 515.

Figure 21A:
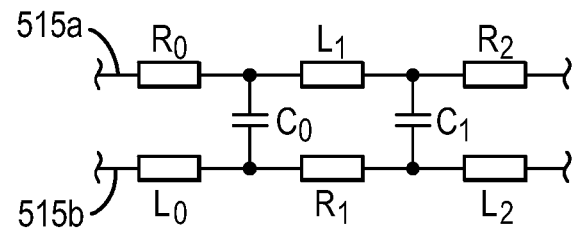
FIGS. 21a and 21b are equivalent circuits for distributed electrical models of a portion of a transmission-line hereof.

FIG. 21a is a distributed electrical equivalent circuit or model of a portion of a transmission-line 515 hereof. It shows alternate distributed resistive (R) and inductive (L) elements connected in series, i.e. $R_0$ connected in series with $L_1$ in turn connected in series with $R_2$ and so on for a portion of loop 515a, and registering $L_0$ connected in series with $R_1$ in turn connected in series with $L_2$ and so on for the adjacent portion of loop 515b; and distributed capacitive elements $C_0$ and $C_1$ shown connected in parallel across the transmission-line 15 thus to the loops 515a and 515b between the resistive/inductive elements $R_0/L_1$ and the inductive/resistive elements $L_0/R_1$, respectively for $C_0$ and between the inductive/resistive elements $L_1/R_2$ and the resistive/inductive elements $R_1/L_2$, respectively for $C_1$: where the identities $R_0=R_1=R_2$, $L_0=L_1=L_2$ and $C_0=C_1$ substantially hold and the illustrated distributed RLC model extends over the whole length of the transmission-line 515. Although not shown, there will actually be a parasitic resistive element in parallel with each capacitive element C, specifically its dielectric material.

Figure 21B:
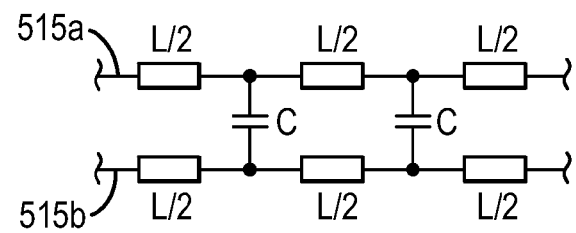

FIG. 21b is a further simplified alternative distributed electrical equivalent circuit or model that ignores resistance, see replacement of those of FIG. 21a by further distribution of inductive elements in series at half (L/2) their value (L) in FIG. 21a. This model is useful for understanding basic principles of operation of transmission-lines embodying the invention.

During a 'start-up' phase, i.e. after power is first applied to the amplifiers 521, oscillation will get initiated from amplification of inherent noise within the amplifiers 521, thus begin substantially chaotically though it will quickly settle to oscillation at a fundamental frequency F, typically within nanoseconds. For each amplifier 521, respective signals from its inverters 523a and 523b arrive back inverted after experiencing a propagation delay Tp around the transmission-line 515. This propagation delay Tp is a function of the inductive and capacitive parameters of the transmission-line 515; which, as expressed in henrys per meter (L) and in farads per meter (C) to include all capacitive loading of the transmission-line, lead to a characteristic impedance Zo=SQR (L/C) and a line traverse or propagation or phase velocity-Pv=1/SQRT(L/C). Reinforcement, i.e. selective amplification, of those frequencies for which the delay Tp is an integer sub-divisor of a half-cycle time gives rise to the dominant lowest frequency, i.e. the fundamental frequency F=1/(2·Tp), for which the sub-divisor condition is satisfied. All other integer multiples of this frequency also satisfy this sub-divisor condition, but gain of the amplifiers 521 'falls off', i.e. decreases, for higher frequencies, so the transmission-line 515 will quickly settle to fundamental oscillation at the frequency F.

The transmission-line 515 has endless electromagnetic continuity, which, along with fast switching times of preferred transistors in the inverters 523a and 523b, leads to a strongly square wave-form containing odd harmonics of the fundamental frequency F in effectively reinforced oscillation. At the fundamental oscillating frequency F, including the odd harmonic frequencies, the terminals of the amplifiers 521 appear substantially unloaded, due to the transmission-line 515 being 'closed-loop' without any form of termination, which results very desirably in low power dissipation and low drive requirements. The inductance and capacitance per unit length of the transmission-line 515 can be altered independently, as can also be desirable and advantageous.

Figure 22:
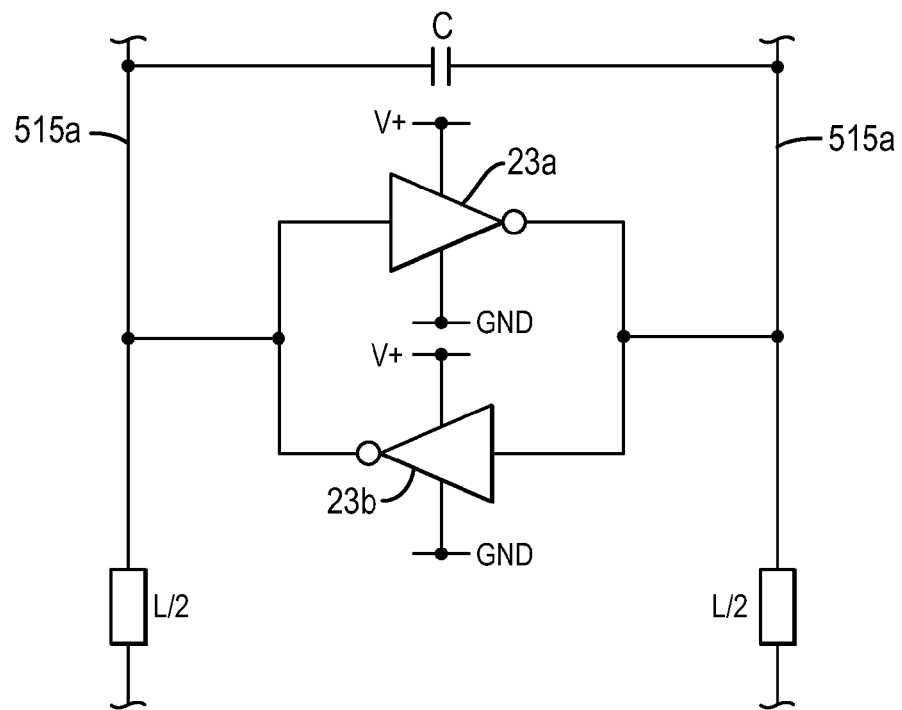
FIG. 22 shows a pair of back-to-back inverters connected across part of a transmission-line.
Figure 23A:
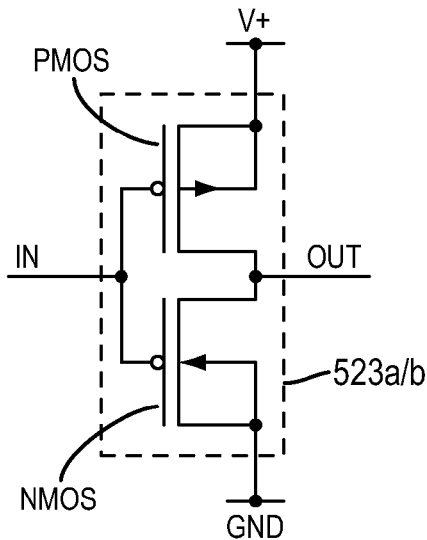
FIGS. 23a and 23b are outline and equivalent circuit diagrams of CMOS back-to-back inverters.

FIG. 22 shows a pair of back-to-back inverters 523a, 523b with supply line connectors and indications of distributed inductive (L/2) and capacitive (C) elements of a transmission-line as per FIG. 21b. FIG. 23a shows N-channel and P-channel Mosfet implementation of the back-to-back inverters 523a and 523b, see out of NMOS and PMOS transistors.

Figure 23B:
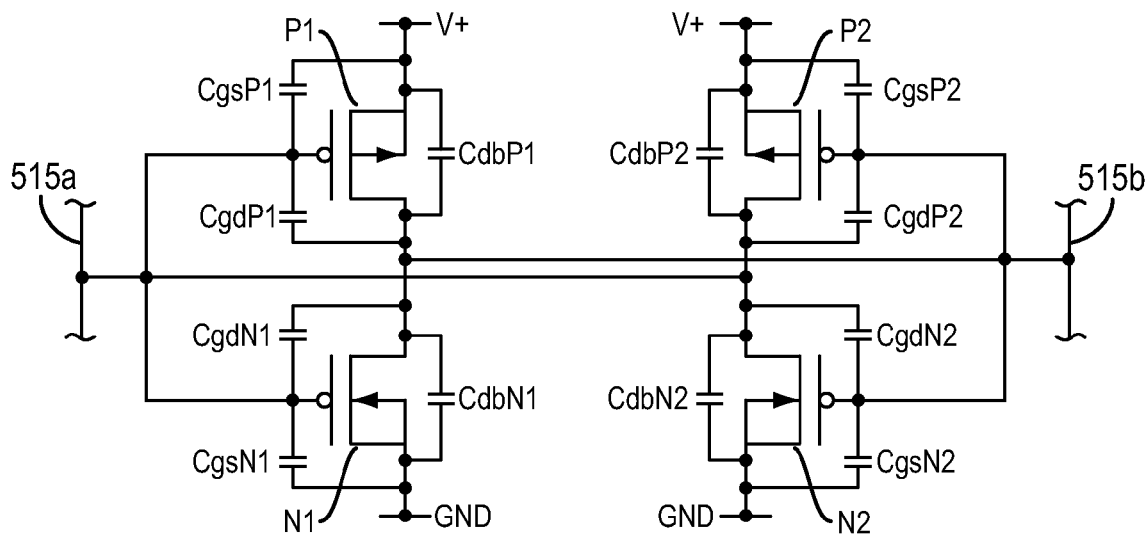

FIG. 23b shows an equivalent circuit diagram for NMOS (N1, N2) and PMOS (P1, P2) transistors, together with their parasitic capacitances. The gate terminals of transistors P1 and N1 are connected to the conductive trace 515a and to the drain terminals of transistors P2 and N2. Similarly, the gate terminals of transistors P2 and N2 are connected to the conductive trace 515b and to the drain terminals of transistors P2 and N2. The PMOS gate-source capacitances CgsP1 and CgsP2, the PMOS gate-drain capacitances CgdP1 and CgdP2, and the PMOS drain-source and substrate capacitances CdbP1 and CdbP2, also the NMOS gate-source capacitances CgsN1 and CgsN2, the NMOS gate-drain capacitances CgdN1 and CgdN2, and the NMOS drain-source and substrate capacitances CdbN1 and CdbN2 are effectively absorbed into the characteristic impedance Zo of the transmission-line, so have much less effect upon transit times of the individual NMOS and PMOS transistors. The rise and fall times of the waveforms Φ1 and Φ2 are thus much faster than for prior circuits.

Although the present invention has been described in considerable detail with reference to certain preferred versions thereof, other versions are possible. Therefore, the spirit and scope of the appended claims should not be limited to the description of the preferred versions contained herein.

What is claimed is:

1. A frequency divider comprising:
   a clock source having a plurality of phases and phase signals, each said phase signal having the same period; and
   a plurality of spot moving stages, each stage having an a spot input, a spot output, and a clock input, the spot input of one stage being connected to the spot output of the previous stage so as to form a ring,
   wherein the clock input of each stage is connected to one of the phase signals of the clock source so as to advance the spot to the next stage after a particular number of phases of the clock source;
   wherein the number of phases of the clock source that advances the spot through all of the stages of the ring determines a total number of periods of the clock source that occur during a single period of the ring, the number of periods of the clock source being the frequency divider ratio; and
   wherein the frequency divided output is available at any of the spot stages.

2. A frequency divider as recited in claim 1,
   wherein the clock source has four phase signals in one a period;
   wherein there are four spot moving stages and each stage is connected to one of the phase signals of the clock source so as to advance the spot by three phases on the occurrence of each clock phase signal; and
   wherein a total of twelve phases of the clock source advances the spot through all of the stages, so that three periods of the clock source occur during one period of the ring.

3. A frequency divider as recited in claim 1,
   wherein the clock source is a ring of moving spot stages, each stage providing a phase signal; and
   wherein the direction of rotation of the clock source is the same as the direction of rotation of the plurality of moving spot stages.

4. A frequency divider as recited in claim 1,
   wherein the clock source is a ring of moving spot stages, each stage providing a phase signal; and
   wherein the direction of rotation of the clock source is the opposite of the direction of rotation of the plurality of moving spot stages.

5. A frequency divider as recited in claim 1, further comprising a decoder that is responsive to change an output signal in response to the presence of a spot in two or more stages of the ring.

6. A frequency divider as recited in claim 5, wherein the decoder provides an output signal that cycles twice during the period of the ring by detecting the presence of the spot in four stages of the ring.

7. A frequency divider as recited in claim 1, wherein the clock source is a rotary traveling wave oscillator and each phase of the oscillator is provided by a physical tap of the rotary traveling wave oscillator.

8. A method of dividing an input frequency to produce an output frequency, the method comprising:
   initializing a spot in only one of a plurality of spot stages configured as a ring; and
   advancing the spot at each stage by a particular number of phases of a multi-phase clock that cycles at the input frequency so that the number of phases it takes to advance the spot through all of the stages determines the number of cycles of the input frequency that occur for each cycle of the output frequency, said output frequency being available at any of the stages.

9. A method of dividing an input frequency as recited in claim 8, further comprising:
   sensing the presence of the spot in two or more stages; and
   providing an output waveform that is responsive to the sensed presence of the spot in multiple stages.

10. A method of dividing an input frequency as recited in claim 8, wherein the multi-phase clock has a direction of rotation and the ring of moving spots stages has a direction of rotation opposite that of the multiphase clock.

11. A method of dividing an input frequency as recited in claim 8, wherein the multi-phase clock is a rotary traveling wave oscillator.

12. A method of dividing an input frequency to produce an output frequency, the method comprising:
   initializing a spot in only one of a plurality of spot stages of a first ring;
   initializing a spot in only one of a plurality of spot stages of a second ring; causing the spot in the first ring to advance at each stage by a particular number of phases of a multi-phase clock such that the first ring cycles with a first period that is N times the period of the multi-phase oscillator and each stage of the first ring provides a phase cycling with the first period, N being the ratio of the total number phases of the multi-phase clock needed to advance through all of the stages of the first ring and the number of phases in a cycle of the multi-phase clock;
   causing the spot to advance at each stage in the second ring by a particular number of phases in the cycle of the first ring such that the second ring has a second period that is M times the period of the first ring and each stage of the second ring provides a phase cycling with the second period, M being the ratio of the total number of phases of the first ring needed to advance through all of the stages of the second ring and the number of phases in a cycle of the first ring, the ratio of the input frequency to output frequency being equal to a product of N and M.

13. A method of dividing an input frequency to produce an output frequency, as recited in claim 12, wherein the first ring has a direction of rotation and the second ring has a direction of rotation opposite that of the first ring.

14. A method of dividing an input frequency to produce an output frequency, as recited in claim 12, wherein the particular number of phases advanced at each stage in the second ring is different for each stage.

15. A method of dividing an input frequency to produce an output frequency, as recited in claim 12, wherein the multiphase oscillator is a rotary traveling wave oscillator.

* * * * *